United States Patent
Dmitriev et al.

(10) Patent No.: US 11,366,382 B2
(45) Date of Patent: Jun. 21, 2022

(54) METHOD AND APPARATUS FOR PERFORMING AN AERIAL IMAGE SIMULATION OF A PHOTOLITHOGRAPHIC MASK

(71) Applicants: Carl Zeiss SMT GmbH, Oberkochen (DE); Carl Zeiss SMS Ltd., Misgav (IL)

(72) Inventors: Vladimir Dmitriev, Tsurit (IL); Joachim Welte, Darmstadt (DE); Bernd Geh, Scottsdale, AZ (US); Paul Graeupner, Aalen (DE); Anja Schauer, Aalen (DE)

(73) Assignees: Carl Zeiss SMT GmbH, Oberkochen (DE); Carl Zeiss SMS Ltd, Misgav (IL)

( * ) Notice: Subject to any disclaimer, the term of this patent is extended or adjusted under 35 U.S.C. 154(b) by 0 days.

(21) Appl. No.: 16/798,696

(22) Filed: Feb. 24, 2020

(65) Prior Publication Data

US 2021/0263406 A1    Aug. 26, 2021

(51) Int. Cl.
G06F 30/33    (2020.01)
G03F 1/70    (2012.01)

(52) U.S. Cl.
CPC .................................. *G03F 1/70* (2013.01)

(58) Field of Classification Search
USPC ........................................................ 716/50–56
See application file for complete search history.

(56) References Cited

U.S. PATENT DOCUMENTS

| | | | |
|---|---|---|---|
| 2007/0065732 A1 | 3/2007 | Lee et al. | |
| 2011/0016437 A1* | 1/2011 | Scherubl | G03F 7/70625 716/52 |
| 2012/0009511 A1 | 1/2012 | Dmitriev | |
| 2012/0084044 A1 | 4/2012 | Dmitriev | |
| 2012/0134542 A1 | 5/2012 | Pang et al. | |
| 2014/0236516 A1* | 8/2014 | Pforr | H01L 22/24 702/84 |
| 2015/0169997 A1* | 6/2015 | Weber | G06T 7/40 382/145 |
| 2017/0228477 A1* | 8/2017 | Solowan | G03F 7/26 |
| 2018/0284600 A1* | 10/2018 | Steigerwald | G03F 1/72 |
| 2019/0107783 A1 | 4/2019 | Thaler et al. | |

FOREIGN PATENT DOCUMENTS

WO    WO 02/16969    2/2002

OTHER PUBLICATIONS

The International Search Report and Written Opinion of the International Searching Authority for International Application No. PCT/EP2021/054388, dated May 28, 2021.
Buttgereit et al., "CD Uniformity correction on 45 nm technology Non Volatile Memory", *Proceedings of SPIE*, vol. 7638, p. 76383K-1-76383K-9, dated Mar. 11, 2010.

* cited by examiner

*Primary Examiner* — Binh C Tat
(74) *Attorney, Agent, or Firm* — Fish & Richardson P.C.

(57) ABSTRACT

The present invention refers to a method for performing an aerial image simulation of a photolithographic mask which comprises the following steps: (a) modifying an optical radiation distribution at a patterned surface of the photolithographic mask, depending on at least one first arrangement of pixels to be generated in the photolithographic mask; and (b) performing the aerial image simulation of the photolithographic mask by using the generated modified optical radiation distribution.

21 Claims, 15 Drawing Sheets

| Feature Type | Illumination Setting | Polarization Type | Target CD for simulation [nm] | Measured CDCR [nm/%] | Simulated CDCR [nm/%] |
|---|---|---|---|---|---|
| 1 | Disar | 1 | 65 | 0.67 | 0.73 |
| 1 | Disar | 2 | 65 | 0.74 | 0.71 |
| 3 | Annular | 3 | 100 | 2.30 | 1.96 |
| 4 | SMO | 4 | 45 | 0.89 | 0.85 |

Fig. 15

METHOD AND APPARATUS FOR PERFORMING AN AERIAL IMAGE SIMULATION OF A PHOTOLITHOGRAPHIC MASK

TECHNICAL FIELD

The present invention relates to the field of performing an aerial image simulation of a photolithographic mask, in particular by taking into account effects of pixels generated in the photolithographic mask.

BACKGROUND

As a result of the shrinking sizes of integrated circuits, photolithographic masks have to project smaller and smaller structures onto a photosensitive layer, i.e. a photoresist dispensed on a wafer. In order to enable the decrease of the critical dimension (CD) of the structure elements forming the integrated circuits (ICs), the exposure wavelength of photolithographic masks has been shifted from the near ultraviolet across the mean ultraviolet into the far ultraviolet region of the electromagnetic spectrum. Presently, a wavelength of 193 nm is typically used for the exposure of the photoresist on wafers. As a consequence, the manufacturing of photolithographic masks with increasing resolution is becoming more and more complex.

In order to increase the yield in a mask manufacturing process, photolithographic masks are repaired whenever possible. One method to correct defects of photolithographic masks is the introduction of arrangements of pixels into the substrate of a photolithographic mask by means of ultrashort laser pulses. For example, pixel writing processes are described in the U.S. patent application Ser. No. 13/179,799 and U.S. Ser. No. 13/252,480. The pixels introduced in a substrate of a photolithographic mask act as scattering centers, and thus locally attenuate the light transmitted through the photolithographic mask.

Metrology tools are available for determining a CD variation across a wafer (as for example the WLCD (Wafer Level Critical Dimension) or AIMS™ (Aerial Image Metrology System) tools of the applicant) for determining placement errors or registration errors of absorber elements on a photolithographic mask, and/or for determining a variation of the optical transmission of a mask substrate across a wafer. Further, tools are also available for introducing an arrangement of pixels into a mask substrate (as for example the RegC©, CDC32 and ForTune® tools of the applicant).

However, the correction of defects of a photolithographic mask by the introduction of pixels into the photolithographic mask requires a lengthy calibration procedure in order to qualify the effect of pixels on the illumination of a wafer. FIG. 1 schematically presents an established process for determining the effect of pixels of a photolithographic mask on the illumination of a wafer. The concept uses the concept of a critical dimension correction (CDC) ratio (CDCR) which describes the pixel effect on the critical dimension on a wafer level as an attenuation per pixel. As indicated in FIG. 1, the determination of wafer level CD requires the application of metrology tools which are external to a photolithographic illumination system. The attenuation of the optical radiation distribution caused by pixels is measured at the actinic wavelength with a metrology sub-system that can be part of the above mentioned RegC© or CDC32 tools. As can be recognized from FIG. 1, the process flow of a CDCR calibration requires one photolithographic mask and two wafer prints. Further, the process requires measurements prior the wafer prints and after the wafer prints. Thus, the calibration process is time-consuming. Similar calibration problems occur when writing pixels into a photolithographic mask in order to correct placement or registration defects.

Furthermore, the above described calibration process must be performed for each photomask type, each illumination setting, each numerical aperture (NA), and each feature type of a photolithographic mask, i.e. for each photolithography process for which defects of photolithographic masks can be corrected by writing pixels into the photolithographic mask. Therefore, the necessary calibration processes limit the application of the above-mentioned defect correction tools for a broader range of processes.

It is therefore one object of the present invention to provide a method and an apparatus which at least partially overcome the above-mentioned drawbacks.

SUMMARY

According to a first aspect of the invention, a method according to patent claim 1 is provided. In an embodiment, the method for performing an aerial image simulation of a photolithographic mask comprises the following steps: (a) modifying an optical radiation distribution at a patterned surface of the photolithographic mask; and (b) performing the aerial image simulation of the photolithographic mask by using the generated modified optical radiation distribution.

Under lithography conditions with well-defined illumination conditions, the effects of pixels introduced into a substrate of a photolithographic mask manifest in a change of the optical radiation distribution in the plane of the pattern elements of the photolithographic mask. For example, pixels can affect an angular distribution of the optical radiation distribution, or in other words, the optical radiation distribution in a pupil plane. Further, also as an example, pixels may scatter a portion of the optical radiation distribution out of an acceptance angle of a projection objective. Thus, pixels may influence a radiation dose on a wafer. The inventive method takes into account the effects of pixels on the illumination of a wafer by combining the optical radiation distribution at the patterned surface of the photolithographic mask which does not have pixels with the effects caused by the pixels on the illumination process of the wafer.

Today's tools for photolithography simulation are powerful engines for the photolithographic technology development. By including the effects of pixels arranged in photolithographic masks in a simulation process of the illumination of a wafer at least a part of the lengthy and thus cost-intensive calibration process of a pixel writing process can be avoided. For example, if the effect of a specific pixel arrangement in a photolithographic mask is considered in the optical radiation distribution at the patterned surface of the photolithographic mask, the effect of different illumination settings of the illumination system on the illumination of a wafer can be analyzed without again running completely through the calibration process. Further, the effect of varying the NA of the illumination system can be analyzed by simulation without the necessity to perform a calibration process for each different NA. Moreover, if the effects of pixels are correctly described in a plane of the pattern or feature elements of the photolithographic mask, effects of different feature types can be analyzed by simulation, thus avoiding at least a part of the time-consuming calibration process. Moreover, the effect of the combined changes of two or more parameters can also be investigated by a simulation process with minimum effort of experimentally checking the obtained results.

The inventive aerial image simulation can be used to assess the impact of a pixel arrangement on the process window (PW). Hence, it enables to find optimal working conditions of a photolithographic illumination system. Further, the inventive method allows anticipating the behaviour of photolithographic weak points. Moreover, it allows optimizing a CDC treatment and/or a registration treatment if this should be necessary. These optimization processes can be executed before performing any mask treatment by CDC and/or before performing wafer prints.

A number of tools for simulating photolithographic processes are available on the market. The inventive method can be implemented in most of the existing simulation solutions with minor modifications of the simulation tools or minor adaptation efforts.

The patterned surface of a photolithographic mask typically coincides with an illumination pupil of a scanner or a stepper of the illumination system and the object level of the photolithographic illumination system. The optical radiation distribution within the illumination system, the photolithographic mask, and the wafer or in the photoresist arranged on the wafer is given by the vector of electrical field $\vec{E}(\vec{x}, t)$ of the electromagnetic waves generated by a light source of the illumination system.

A photolithographic mask comprises transmissive and reflective photolithographic masks. Further, the term "a photolithographic mask" also comprises a template for the nanoimprint technology. Moreover, the terms "photolithographic mask", "photomask" or simply "mask" are used as synonyms within this application.

Step a. of the inventive method can comprise determining a collective modifying effect of the at least one first arrangement of pixels for each point at the patterned surface, wherein the determining can comprise a combination of modifying effects of a plurality of pixels of the at least one first arrangement of pixels which contributes optical radiation to this point.

The plurality of pixels of the at least one first arrangement of pixels can essentially comprise all pixels which contribute optical radiation to the point at the patterned surface.

The collective modifying effect of one point at the patterned surface of the mask takes into account the effects of a portion or of essentially all the pixels "seen" from that point. In order words, the collective modifying effect includes the effect of some or all pixels which lie within the cone(s) from which the point in the patterned surface receives optical radiation or light. The collective modifying effect of one point in the patterned surface is in the following also called scattering kernel of the respective point. In more detail, it is necessary to distinguish two cases: (i) a mask prior to writing pixels into the mask, and (ii) the mask after pixels have been written into the mask. In case (i), the NA limits the accepted incident angle of the optical radiation distribution on the mask. In case (ii), a significantly larger amount of the optical radiation originates from large incident angles as a result of light scattering or scattering of the optical radiation by the pixels. This means that pixels not only have the effect of attenuating or modifying illuminating rays of the optical radiation but also scattering light to other portions within the pupil area. In order to consider this scattering effect properly, it is necessary to significantly increase the effective illumination NA. This means the cone of the incoming modified optical radiation may be as high as 180°.

The term "essentially" means here as well as at other positions of this application an experimental determination of a quantity within its error limit when using state of the art metrology tools.

Thus, as outlined above, the collective modifying effect of the plurality of pixels of at least one first arrangement of pixels at a point of the patterned surface of the photolithographic mask can change an angular distribution of the optical radiation distribution received at this point.

Changing the angular distribution of the optical radiation distribution can comprise increasing the angular distribution of the optical radiation distribution.

The collective modifying effect includes the effect of the pixels "seen" by the point at the patterned surface as well as the effect of redistribution of optical radiation induced by the pattern elements as a consequence of the angular distribution changed by the pixels of the at least one first arrangement of pixels. The concept of the collective modifying effect or the scattering kernel modifying the optical radiation distribution at a patterned surface of a photolithographic mask provides a reliable model for predicting pixel effects in a photolithographic simulation process. As already mentioned above, the simulation can be performed prior to perform any mask treatments or wafer prints.

Modifying the optical radiation distribution at the patterned surface can comprise modifying an optical radiation distribution without the at least one first arrangement of pixels with the determined collective modifying effect for each point of the patterned surface.

This means that the modified optical radiation distribution is generated by combining the optical radiation distribution of a mask which does not have an arrangement of pixels at the patterned surface and the collective modified effect or the scattering kernel at each point at the patterned surface. By this process a synthetic optical radiation distribution is generated at the patterned surface of a photolithographic mask.

Modifying the optical radiation distribution can further comprise multiplying the optical radiation distribution without the at least one first arrangement of pixels with the collective modifying effect at each point at the patterned surface. Moreover, modifying the optical radiation distribution can comprise convoluting the optical radiation distribution without the at least one first arrangement of pixels with the collective modifying effect at each point at the patterned surface, wherein the collective modifying effect of a point at the patterned surface depends on a lateral position of the point at the patterned surface.

Step a. of the inventive method can be based on at least one of: a look-up table, a metrology system measuring an effect of at least one second arrangement of pixels generated in a mask substrate, and a simulation model simulating an effect of individual pixels.

Measuring the effect of the at least one second arrangement of pixels within a mask substrate can comprise illuminating the second pixel arrangement at a wavelength different than the actinic wavelength and correcting the effect of the wavelength difference, in particular correcting wavelength dependent scattering angles. In a first example, a component of a scattering kernel may be measured by using a monopole illumination and by measuring a two-dimensional (2D) result of the scattering. It is then possible to use the derived scattering kernel to calculate a modified optical radiation distribution or a modified illumination. In a second example, it is possible to form several basic illumination types and in a second step interpolate the result of the scattering process. Alternatively, a result of a convolution of the scattering kernel with an illumination can directly be measured by forming a scanner illumination and measuring the scattering result. Further, the measurement may be performed using an offline measurement tool, as for example an ellipsometer. The measurement of the resulting scattering may of be directly performed on a scanner by using pupil qualification scripts.

Step a. of the inventive method can further comprise determining mask pattern data from a design pattern, a measured pattern, or both.

Prior to step a. the inventive method can comprise measuring the optical radiation distribution at the patterned surface of the photolithographic mask or calculating the optical radiation distribution at the patterned surface from a radiation source, optical elements, a numerical aperture (NA), and an illumination setting of an illumination system.

Step a. of the inventive method can further comprise normalizing the modified optical radiation distribution. Normalizing the modified optical radiation distribution can comprise multiplying the optical radiation distribution without the at least one first arrangement of pixels with an attenuation of the collective modifying effect of each point in the patterned surface.

A further aspect comprises the step of applying a photoresist model for simulating the effect of the illumination of the photoresist arranged on the wafer.

After applying the photoresist model and performing simulation of the photoresist, the effect of the pixel arrangement in the photomask on the pattern to be transferred in a wafer can be analyzed by means of a simulation process.

In another aspect step b. further comprises considering a coherence of the optical radiation distribution when performing the aerial image simulation of the photolithographic mask.

The consideration of the coherence of the optical radiation distribution when simulating an aerial image leads to an increased precision of the simulated aerial image at the cost of a longer simulation time.

According to still another aspect step a. further comprises retrieving a phase of the optical radiation distribution.

In order to determine a phase of the optical radiation distribution and thus qualifying the optical coherence of the optical radiation distribution, it is necessary to describe the scattering process of a pixel with the optical radiation by a four-dimensional (4D) kernel function.

A further aspect comprises the step of determining a critical dimension correction ratio and/or an image placement error correction of the wafer.

The inventive method can be applied to both the critical dimension correction (CDC) and the placement or registration correction process. Further, it can determine a CDC ratio (CDCR) and a transfer coefficient of a specific mask type.

Another aspect further comprises the step of comparing the determined critical dimension correction ratio and/or the image placement error correction with measurements performed with a metrology tool.

Changing the modified optical radiation distribution in step a. can comprise modifying at least one parameter of: the at least one first arrangement of pixels, an illumination setting of the illumination system, the NA of the illumination system, and a feature type of the photolithographic mask.

Changing the at least one first arrangement of pixels can comprise at least one of: changing a shape of an individual pixel, changing the arrangement of pixels arranged on a regular or an irregular two-dimensional grid, and changing the arrangement of pixels arranged in a regular or an irregular three-dimensional arrangement.

Another aspect further comprises the step of performing the aerial image simulation and a photoresist simulation with the changed modified optical radiation distribution.

A further aspect comprises one or more of the steps of: (c) measuring a photolithographic mask without having an arrangement of pixels with an aerial image metrology tool; (d) generating at least two different arrangements of pixels in the photolithographic mask; (e) measuring the at least two different arrangements of pixels with the aerial image metrology tool; and (f) determining a calibration relation of the aerial image simulation based on the measurement data of the aerial image metrology tools obtained in steps (c) and (e).

But it has to be kept in mind that aerial image metrology tools can only measure a portion of the effects caused by the different arrangements of pixels in the photolithographic mask. As already discussed above, this is due to the limited NA of the imaging objective of the aerial image metrology tools. For example, an aerial image metrology tool can only capture a relative attenuation of the illumination pupil but cannot in detail capture the energy redistribution within the pupil.

An aspect comprises one or more of the steps of: changing at least one of the parameters; performing the aerial image simulation; and determining the effect of the changed at least one parameter on the illumination of the wafer based on the calibration relation in a closed loop simulation.

By comparing aerial image simulations with images measured by an AIMS™ metrology tool, the printing and analyzing of wafers can be avoided at a large extent. This opens new possibilities for the application of correction processes of photolithographic masks.

A further aspect comprises the step of comparing the determined critical dimension correction ratio and/or the image placement error correction for a photolithographic mask having the pixel arrangements of steps (c) and (d) with measured aerial images and/or simulated aerial images in order to determine a second calibration relation.

The second calibration relation relates aerial image simulations to changes of a wafer without using a photoresist model for each simulation, and in particular without performing wafer prints. Thus, it allows to establish a link between simulated aerial images and an induced CDCR of a wafer.

In a further aspect a computer program comprises instructions for performing the method steps of any of the above discussed aspects.

Another aspect comprises a simulation unit, the simulation unit being adapted to perform the method steps of any of the above discussed aspects.

DESCRIPTION OF DRAWINGS

In order to better understand the present invention and to appreciate its practical applications, the following figures are provided and referenced hereafter. It should be noted that the figures are given as examples only and in no way limit the scope of the invention.

FIG. 15 presents a table comparing measured and simulated CDCR data for different feature types, illumination settings, polarization types, and design or target CDs.

DETAILED DESCRIPTION

In the following, the present invention will be described hereinafter in more detail with reference to the accompanying figures, in which exemplary embodiments of the invention are illustrated. However, the present invention may be embodied in different forms and should not be construed as limited to the embodiments set forth herein. Rather, these embodiments are provided so that this disclosure will be thorough and will convey the scope of the invention to persons skilled in the art.

Figure 1:
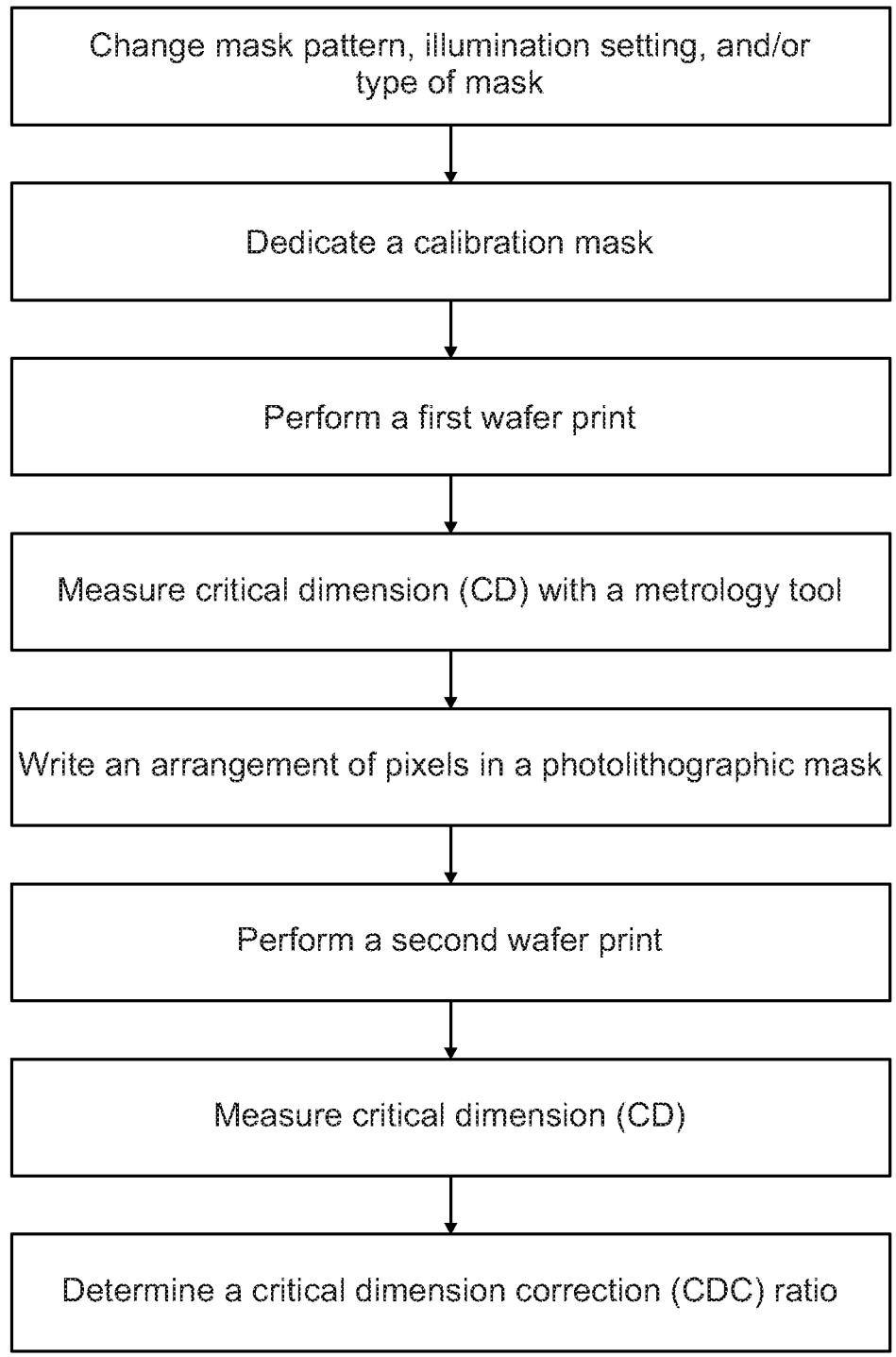
FIG. 1 schematically presents essential steps of a calibration process of a mask correction process using pixels written into a photolithographic mask according to prior art.

As already discussed in the first section, the flow chart of FIG. 1 describes a calibration process of a critical dimension correction (CDC) process performed by writing pixels into a photolithographic mask. The method described in this application is not limited to improve a CDC process. The inventive method can also accelerate the correction of placement errors or registration errors of feature elements of a photolithographic mask by writing pixels into the mask. Generally, the inventive method can be applied to enhance a process which tunes an optical element by writing pixels into the optical element.

Figure 2:
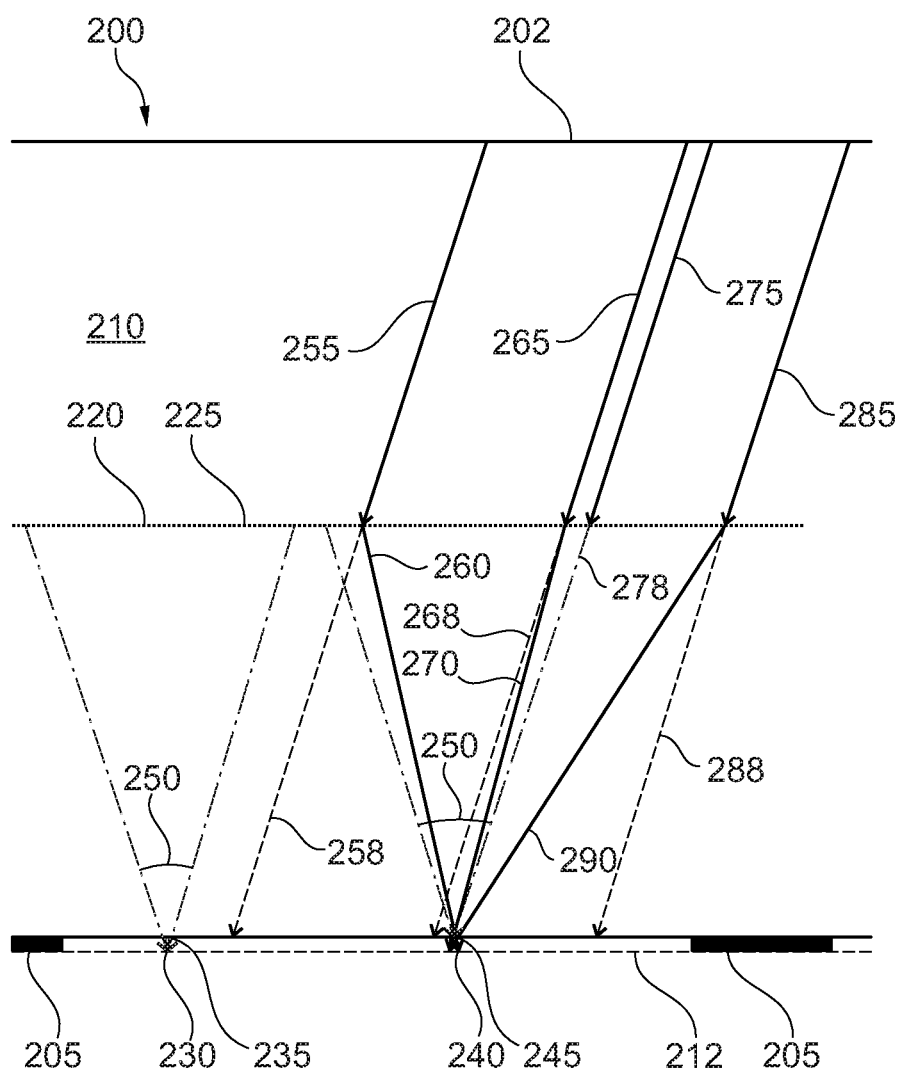
FIG. 2 schematically shows a section of a photolithographic mask having an arrangement of pixels and illustrates collective modifying effects at one point of the patterned surface of the photolithographic mask.

The diagram 200 of FIG. 2 schematically shows a section of a photomask 210. The mask 210 has on its patterned surface 212 pattern or feature elements 205. The feature elements 205 absorb the optical radiation incident on the front surface 202 of the mask 210 and meet with the pattern elements 205, and thus generating a predetermined pattern on a wafer arranged below the mask 210. The depth of a feature element 205 is typically in the range of 50 nm to 100 nm. The lateral dimension of a feature element 205 depends on the pattern to be generated on a wafer and the wavelength used to project the pattern 205 of the photomask 210 onto a wafer. Presently, preferably ArF excimer laser systems are used for illumination purposes which generate optical radiation at a wavelength of about 193 nm.

The mask 210 has an arrangement of pixels 225 which is preferably generated in the middle between the front surface 202 and the patterned surface 212. Typically, a photomask 210 has a thickness of 6.35 mm. A pixel 220 of the arrangement of pixels 225 changes the properties of the optical radiation or the light incident through the front surface 202 onto the pixel 220 by scattering (Mie scattering), diffraction (if the pixel 220 is part of an arrangement of pixels 225 which is arranged in form of a grid), refraction (where the pixel 220 acts as a weak microlens) and reflection.

FIG. 2 shows two points 230 and 240 of the patterned surface 212 of the mask 210 and a cross-section through a cone 250, wherein the apex of the cone 250 is located at the points 230 and 240. The effect of the pixels 220 onto an optical radiation distribution is illustrated by the light rays 255, 265, 275, 285 of a monopole setting incident on the front surface 202 of the photomask 220. The rays 255, 265, 275, 285 represent an illumination at an extreme NA angle. The rays 258, 268, 278, 288 denote the portion of the optical radiation distribution which is essentially not affected by the pixels 220 of the pixel arrangement 225. In detail, the ray 278 represents the portion of the optical radiation distribution at the point 240 which is not affected by the pixels 220 of the pixel arrangement 225 and hits the point 240 of the patterned surface 212.

The light rays 260, 270, 290 present the portion of the optical radiation distribution which is modified by the pixels 220 and but also contributes to the illumination at the point 240 of the patterned surface 212. The ray 270 represents the portion of the optical radiation distribution which hits the point 240 at an angle which only slightly differs from the angle under which the optical radiation distribution 255, 265, 275, 285 incidents on the front surface 202 of the mask 210. Thus, the ray 270 symbolizes an example of a small scattering angle.

The light ray 260 represents a scattered light portion hitting the point 240 within the original illumination NA but having an angle which is significantly different from the angle of the incident optical radiation distribution 255, 265, 275, 285. Hence, the ray 260 illustrates the portion of the optical radiation distribution which is redistributed by the pixels 220 of the pixel arrangement 225.

The light ray 290 represents the portion of the optical radiation distribution 255, 265, 275, 285 which incidents on the point 240 at an angle which is larger than the original illumination NA. Hence, the ray 290 illustrates a dark field illumination portion of the optical radiation distribution 255, 265, 275, 285 caused by the pixels 220 of the pixel arrangement 225.

Further, FIG. 2 shows a cut through a two-dimensional (2D) arrangement 225 of pixels 220. Of course, it is also possible to write a three-dimensional (3D) arrangement of pixels in the photomask 210 (not indicated in FIG. 2).

Figure 3:
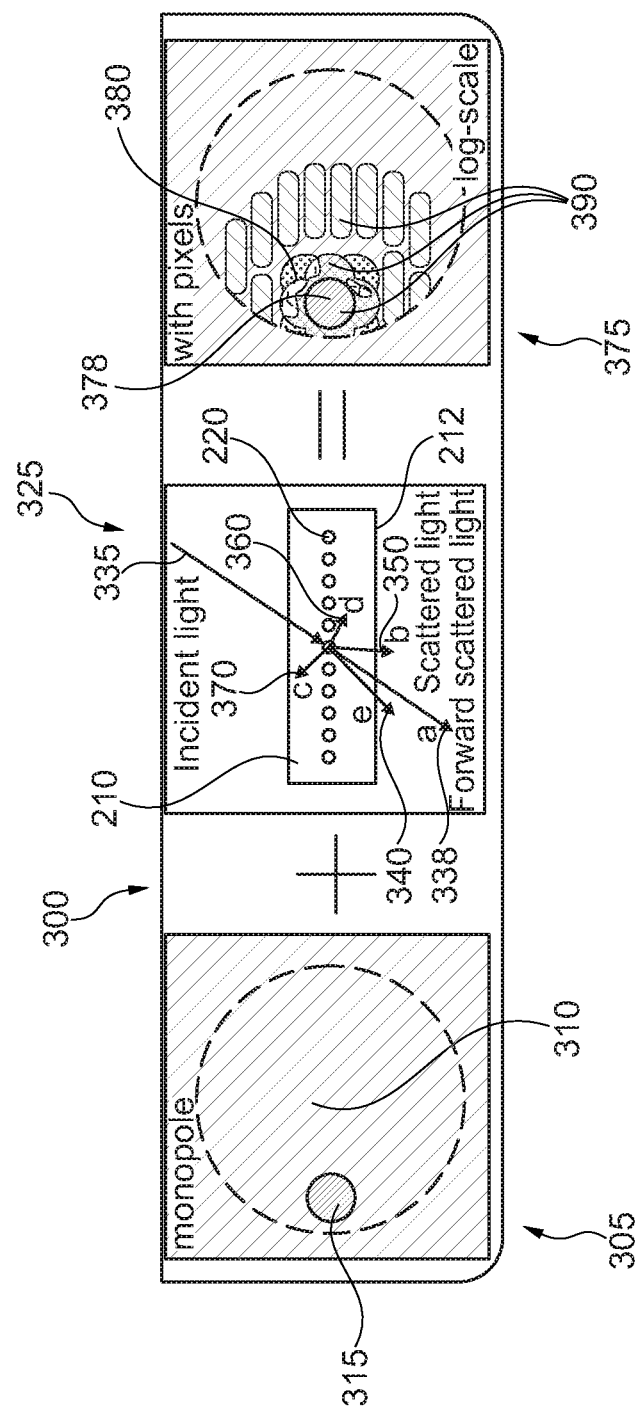
FIG. 3 illustrates the generation of collective modifying effects caused by an arrangement of pixels in the mask for a monopole illumination.

The diagram 300 of FIG. 3 schematically shows the scattering metrology for pixels. The diagram 300 provides the details of FIG. 2 in a broader context. The left part 305 of FIG. 3 presents an off-axis monopole setting 310 having an aperture 315 through which an optical radiation distribution is transmitted to a photomask 210.

The middle part 325 of FIG. 3 shows a section of the mask 210 of FIG. 2 having the pixels 220 arranged in the middle of the mask 210. The pattern elements 205 of the mask 210 are not shown in the partial image 325 of FIG. 3. In the example depicted in the middle part 325 of FIG. 3, the light ray 335 indicates the optical radiation distribution which obliquely incidents on the mask 210. The light ray 338 or the light ray a transmits the mask 210 essentially without being affected by the pixels 220 of the mask 210. The ray 340 or the ray e symbolizes a small scattering angle with respect to the incident optical radiation distribution 335. The ray 350 or the ray b illustrates a medium angle scattering, and the ray 360 or the ray d presents a portion of the optical intensity distribution which has been scattered by a large angle with respect to the incident illumination 335. The light ray 370 or the light ray c represents the portion of the optical radiation distribution which is back-scattered.

The length of the rays 338, 340, 350, 360 and 370 symbolizes the size of respective portion of the optical radiation distribution. This means that the arrangement 225 of pixels 220 scatters the major portion of the incident optical radiation 335 in forward direction, which is parallel to the direction of the incident beam of the optical radiation distribution 335. But a small fraction of the incident light beam 335 is scattered in directions out of the direction of the incident light beam 335.

The changes induced by the arrangement 225 of pixels 220 on the incident light beam 335 can be measured. Furthermore, the effect of the pixel arrangement 225 can be analyzed by using various other illumination settings. Some details of such measurements are given below.

But it is also possible to determine the modifications performed by the pixel arrangement 225 by performing a simulation. For this purpose, it is necessary to have a model for a pixel 220 which describes the changes a pixel 220 can have on incident optical radiation 335. By combining the changes of a multitude of pixels 220 forming a pixel arrangement 225, the modifications induced by the pixel arrangement 225 can be analysed. The document WO 02/16 969 describes a model which allows analysing the effects of an arrangement 225 of pixels 220 in an optically transparent material.

The right partial image 375 of FIG. 3 presents the optical radiation at the rear surface 212 of the mask 210. The part 378 of the photomask 210 through which the monopole radiation directly passes is on three sides surrounded by a kind of halo which is caused by the changes induced by the pixel arrangement 225 to the incident optical radiation 335. In the following, it is also called that the pixel arrangement 225 blurs the incident optical radiation 335. The optical intensity in the part 335 of the photolithographic mask 210 which passes directly through the mask substrate 210, i.e. essentially without interaction with the pixels 220 is much larger than the optical intensity scattered in the surrounding part 380. Therefore, the optical intensity is represented on a logarithmic scale in the left partial image 375 of FIG. 3. Thus, the right partial image 375 of FIG. 3 provides preliminary collective modifying effects 390 for each point at the rear side 212 of the mask substrate. The preliminary modifying effects 390 comprise all effects caused by the pixel arrangement 225.

Figure 4:
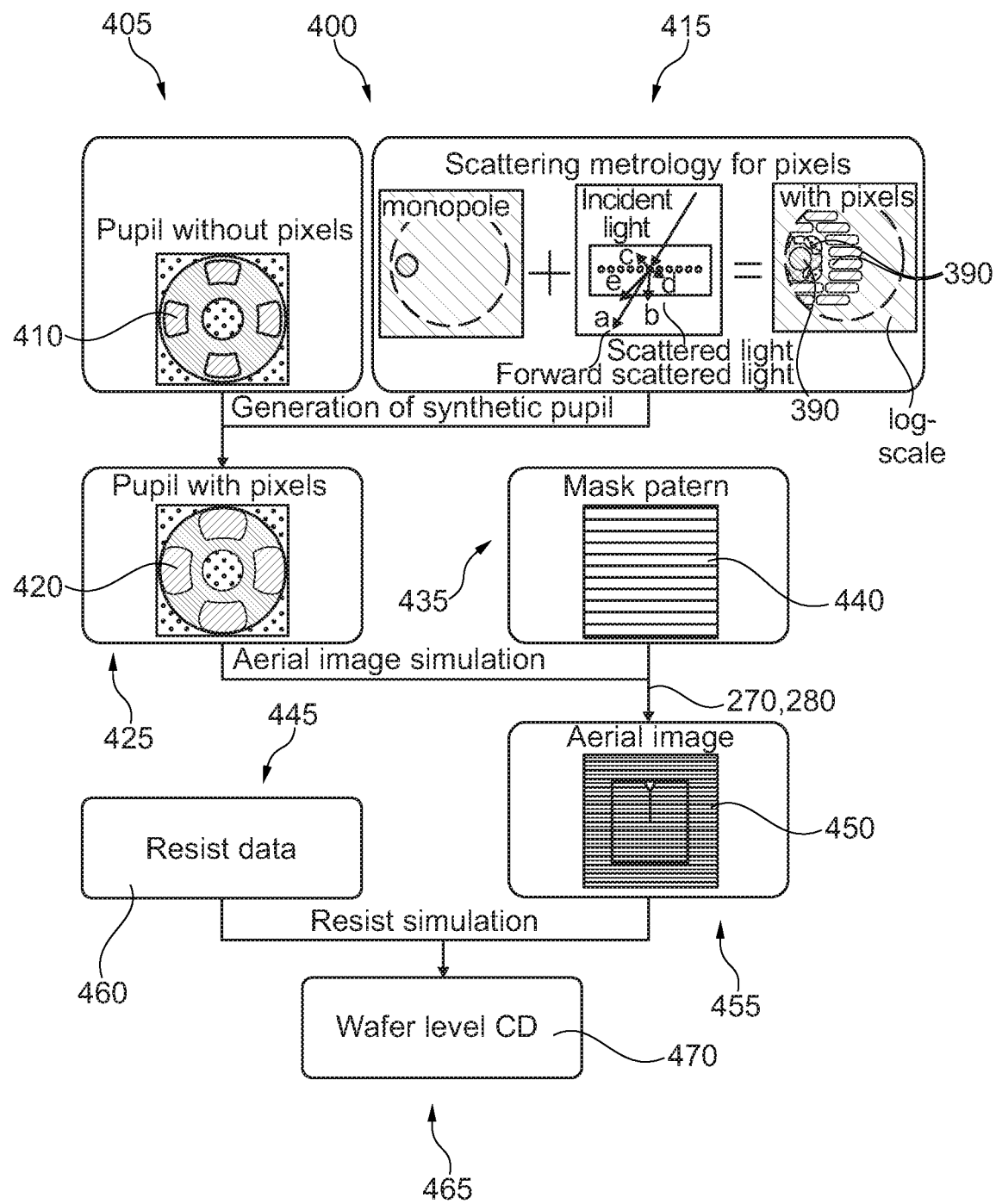
FIG. 4 schematically represents an example of a photolithographic simulation process incorporating an aerial image simulation process, wherein the aerial image simulation process considers a pixel arrangement of the photomask.

The diagram 400 of FIG. 4 illustrates an overview of a photolithographic simulation process which takes into account the changes of a photomask 210 induced by an arrangement 225 of pixels 220 at the illumination of a wafer. In FIGS. 2 and 3 a monopole illumination setting of a scanner has been considered. This exemplary illumination setting is reasonable for demonstrating the effects of a pixel arrangement 225 on the optical radiation distribution at the rear surface 212 of the photomask 210. But in a real lithographic case, the illumination is typically more complex and, for example, has a shape of a dipole, a quadrupole, a quasar setting or even more complex settings like SMO (Source Mask Optimization) setting.

In the example of FIG. 4, the upper left partial image 405 shows the optical radiation distribution 410 of a quadrupole illumination setting of an illumination system. In the following, it is assumed that the optical radiation distribution is homogeneous across the openings of the respective illumination setting. This means the original illumination for a pattern 205 at different positions is the same. The radiation distribution 410 can be obtained by measuring the illumination setting with a metrology tool. Alternatively, and/or additionally, the radiation distribution 410 can be generated by simulating the light source, the optical components as well as the settings (e.g. the NA and the illumination setting) of the illumination system. At the moment, the coherence property of the optical radiation distribution is ignored, i.e. the Hopkins approximation is presently used for simulating the optical radiation distribution. However, it is not required to ignore the coherence property of the optical radiation distribution in the method described in this application. Rather, if necessary, the coherence property can be considered at cost of a longer simulation time. Further, additional efforts are necessary in order to retrieve the phase of the optional radiation and to qualify the coherence. When considering the coherence evaluation, the scattering must be described by a four-dimensional (4D) complex kernel function.

It is also possible that the optical radiation distribution can be obtained from design data.

The upper right picture 415 of FIG. 4 again presents the diagram 300 of FIG. 3 for determining the scattering property of the pixels 220. The synthetic illumination determination can be performed by measuring the scattering of the pixels with a scatterometer and/or an ellipsometer. Details of a scatterometer measurement are discussed in the context of FIG. 6.

It is also possible to simulate the scattering property of the pixels 220 if the shape of the individual pixels 220 and the density of the pixels 220 are known in the pixel arrangement 225. Further, the scattering property of the pixels 220 can also be approximated by using the Mie scattering approach. Moreover, it can be measured using a scanner metrology in combination with an AIMS' metrology. Some phenomena generated by pixels 220 can only be simulated when considering a pixel 220 as a structure having a complex shape.

The determination of the scattering property of the pixels 220 has to be done for every angle of the incident optical radiation distribution, e.g. for the angles θ and φ in a spherical coordinate system, and for every scattering angle of the scattered optical radiation distribution, e.g. for the angles θ and φ in a spherical coordinate system. Further, it must be done for each polarization state of the optical radiation distribution incident on the photomask 210 and for each polarization state of the scattered light. Often, the polarization state of optical radiation is described using Stokes parameters. The Stokes parameter can be summarized in a Stokes vector having four components (N=4). In case of unpolarized optical radiation, the Stokes vector reduces to a scalar (N=1). The data set describing the scattering of optical radiation at pixels 220 comprises (2D·N)·(2D·N)=4D·N² dimensions, wherein 2D denotes two dimensions and 4D denotes four dimensions (three dimensions and the phase).

The preliminary modifying effect 390 of the pixel arrangement 225 of the mask 210 determined as described above can be used to generate a synthetic illumination pupil of an illumination system. Or in other words, the determined pixel scattering behaviour is used to generate a modified optical radiation distribution at the surface 212 of the photomask 210. This process is illustrated in the partial image 425 of FIG. 4. In case of a uniform pixel arrangement 225, i.e. a pixel arrangement 225 having a uniform pixel density, the resulting or modified optical radiation distribution can be performed by convoluting the determined pixel scattering kernel with the incident optical radiation distribution 335. In the general case, a 4D integration has to be performed for the 2D resulting angles of the optical intensity distribution scattered by the pixels 220 for all polarization states of the scattered optical intensity distribution.

The synthetic illumination pupil 420 essentially corresponds to the optical radiation distribution at the patterned surface 212 of the photomask 210. Then the resulting modified optical radiation distribution at the rear surface 212 of the photomask 210 is used for generating a wafer level aerial image by using a lithographic simulator. The aerial image simulation is represented by the partial image 435 in FIG. 4. In order to perform an aerial image simulation of the photomask 210, the synthetic optical radiation distribution 420 has to be transmitted through the mask pattern 440 of the photomask 210. Thus, the simulation process takes into account the properties of the pattern 205 including the pattern design data, the material composition of the pattern 205 and the 3D dimensions of the pattern elements 205. Further, the simulation process also considers the optical properties of the projection objective arranged between the photomask 210 and a wafer. For example, the optical properties of the projection objective comprise its NA and/or aberrations.

As already discussed above, the angular distribution through which each point at the patterned surface 212 receives optical radiation is modified by the pixel arrangement 225. The enlarged angular distribution also modifies the action of the feature elements 205 of the mask pattern 440 on incident optical radiation. This effect is considered by converting the preliminary collective modifying effect 390 into the collective modifying effect 235 and 245 for each point at the patterned surface 212 prior to execute the aerial image simulation 450 of the photomask 210.

The simulation process described in the context of FIG. 4 up to now comprises the inventive aerial image simulation of a photomask 210 presented in this application. The modified optical radiation distribution serves as an input for an available photolithography simulation tool. The results presented in this application are obtained with Sentaurus™ Lithography (S-Litho) from the company Synopsys Inc. But alternative simulation tools exist and should principally give the same results. For instance, alternative tools could be Prolith, Dr. Litho, or JWave. For example, these simulation tools use apart from the modified optical radiation distribution settings of the illumination system, i.e. the NA and the illumination setting, polarization and coherence level of the optical radiation, mask features and parameters of the photoresist as input data.

A particular alternative would be the integration of the modified optical radiation distribution at the patterned surface into a holistic lithographic computational flow such as the Litho Insight product of ASML/Brion. For example, this tool allows to feed an optical radiation distribution measured by a scanner into the system, or to simulate the effect a modified optical radiation distribution has on the process window (PW) or weak points of the photolithography process. Further, it allows tuning parameters in order to match specific requirements or validating the simulation results with wafer prints.

In a next step of FIG. 4, as symbolized by the partial image 455, a photoresist model parameterized with photoresist data 460 or photoresist parameters 460 can be used to investigate the action of the optical radiation passing through the mask pattern 440 and incident on the photoresist or resist arranged on a wafer. This means, the simulation process generates an image of the photoresist after performing an etching step for the excessive photoresist. For this purpose, the simulation process must consider a plurality of the mechanical, optical, and/or chemical properties of the photoresist arranged on the photomask 210. The result is illustrated by the partial image 465 in FIG. 4. The simulation processes can be executed with one of the simulation tools described above.

Moreover, the photolithographic simulation process discussed in FIG. 4 allows analysing the effect of one or more pixel arrangements 225 of the photomask 210 on the critical dimension (CD) on a wafer level. As already indicated, the effects of one or more pixel arrangements 225 on a registration correction process can also be investigated in an analogue manner. FIG. 4 describes the determination of a critical dimension correction (CDC) ratio for a photolithographic mask. The person skilled in the art will appreciate that the simulation process can also be used for determining the effect of a pixel arrangement 225 in a registration correction process.

Additionally, the person skilled in the art will recognize that the simulation process described above is not restricted to the simulation of an aerial image of a specific pattern 205 of the mask 210, or for additionally simulate a resist arranged on a photomask 210 for a specific pattern 205. Rather, the simulation process described in this application can be used for simulating other wafer processing steps in order to obtain the resulting pattern properties for a specific pixel arrangement 225 written in the photomask 210.

Figure 5:
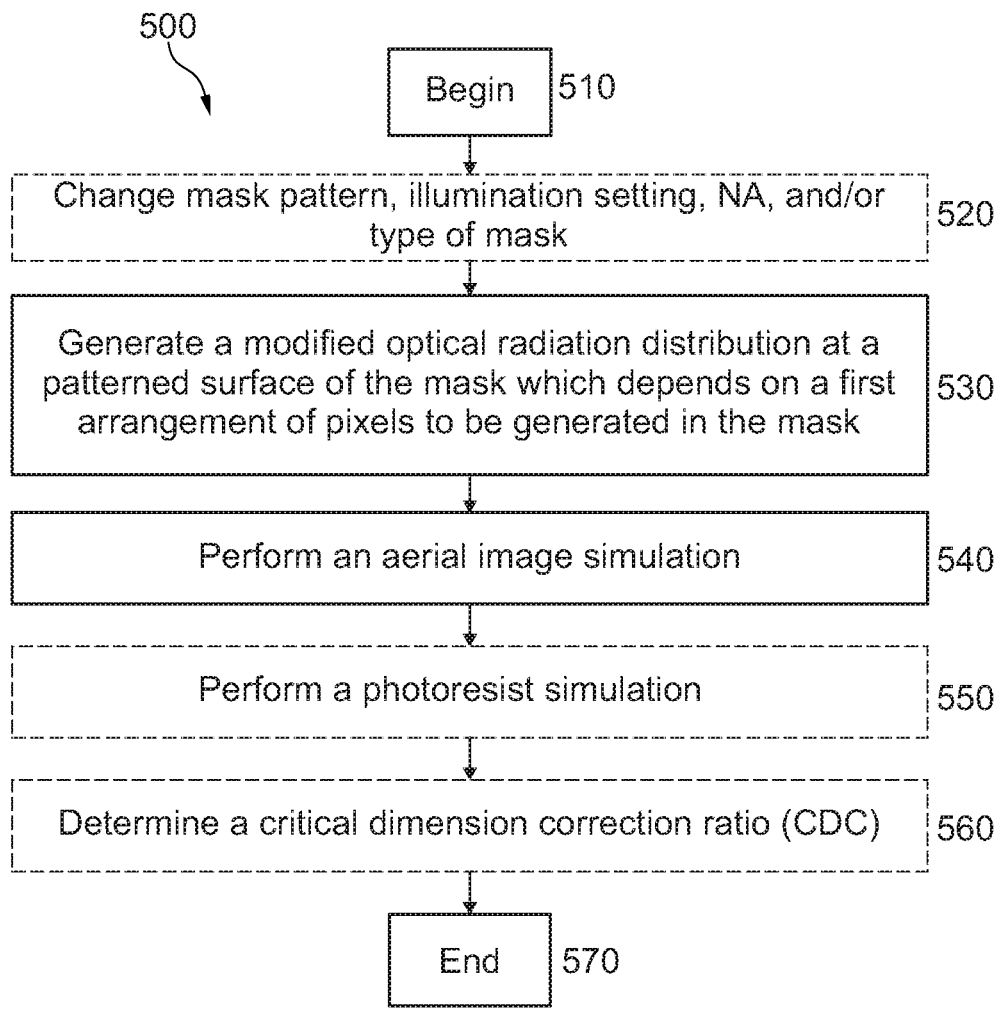
FIG. 5 presents a flow chart of the photolithographic simulation process of FIG. 4.

FIG. 5 summarizes the major process steps of the photolithographic simulation process discussed in the context of FIG. 4 in form of a flowchart 500. The process begins at step 510. At step 520, a parameter of the simulation process is changed. This can comprise a change of a mask pattern, an illumination setting of the illumination system, the NA of the illumination system, and the type of the photolithographic mask. Instead of one parameter two or more parameters can also be varied. It is also possible changing the pixel arrangement 225 of the photomask 210 and keeping the other parameters constant.

In step 530, a modified optical radiation distribution is generated at the patterned surface 212 of the photomask 210 by combining the optical radiation distribution of a mask without having pixels and the effect of one or more pixel arrangements 225 summarized in the collective modified effect 235, 245 or the scattering kernel 235, 245. The collective modifying effects 235, 245 collect the effects of the pixels 220 on the optical radiation seen by the respective point 230, 240 at the patterned surface 212. The collective modifying effect 235, 245 also includes the redistribution effect of the pattern elements 205 of the mask pattern 440 caused by increasing the angular distribution of the cone 250 due to the scattering of the incident optical radiation at the pixel arrangement 225 of the mask 210.

At step 540, an aerial image simulation of the photomask 210 is performed based on the modified optical radiation distribution to obtain a simulated aerial image of the photomask 210. The steps 530 and 540 of the flow chart 500 are mandatory steps for a method which performs an aerial image simulation of a photolithographic mask discussed in this application. Therefore, these steps are framed with solid lines. The further process steps in the flow chart 500 are optional steps and their frames are indicated as dotted lines.

At step 550, the effect of the photoresist spread on a wafer is simulated using a photoresist model parameterized with photoresist data of the applied resist. Then, at step 560, the critical dimension correction ratio (CDCR) is determined. The method ends at step 570.

As already indicated above, an analogue flow chart can be established in a similar manner for a registration correction (RegC) process (not shown in FIG. 5).

By comparing FIGS. 1 and 5, it is recognized that in contrast to FIG. 1 the flow chart 500 of FIG. 5 does not require wafer prints. Further, it also is not necessary to perform measurements of the critical dimension (CD). Thus, the flow chart 500 of FIG. 5 for determining the CDCR needs much less effort than the process described in the flow diagram indicated in FIG. 1.

The CDCR is defined as: $CDCR = \frac{CD_{post} - CD_{pre}}{attenuation}; [CDCR] = \frac{[nm]}{[\% \, att]}$ $CD_{post}$ is the critical dimension after writing pixels 220 into the photolithographic mask 210, and $CD_{pre}$ denotes the CD of the photomask 210 prior to writing the pixels 220. The attenuation describes the loss of optical radiation caused by the pixels 220 of the pixel arrangement 225. The attenuation of the photomask 210 is referred to the optical radiation incident on the front surface 202 of the photolithographic mask 210.

Figure 6:
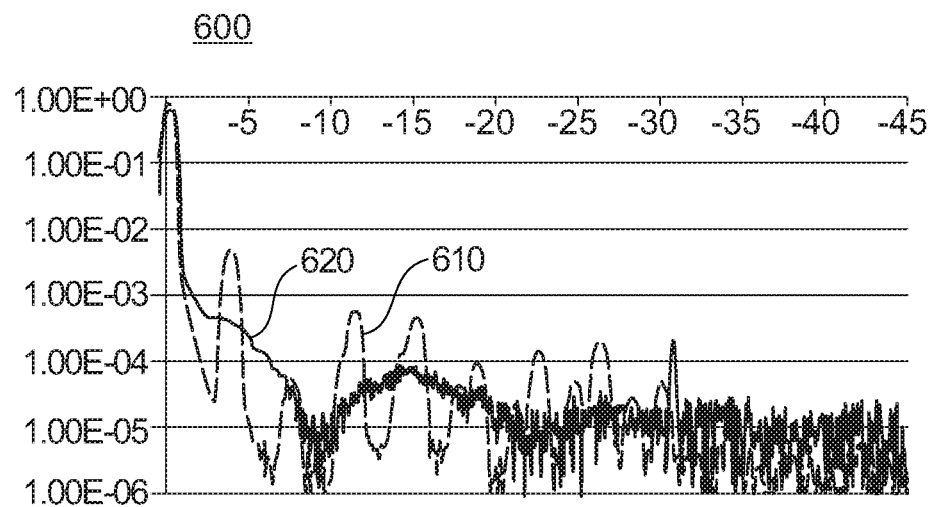
FIG. 6 shows in the upper partial image an ellipsometer measurement and in the lower partial image a superposition of several ellipsometer measurements performed at different directions at the patterned surface or the illumination pupil of a scanner or a stepper of an illumination system.
Figure 6:
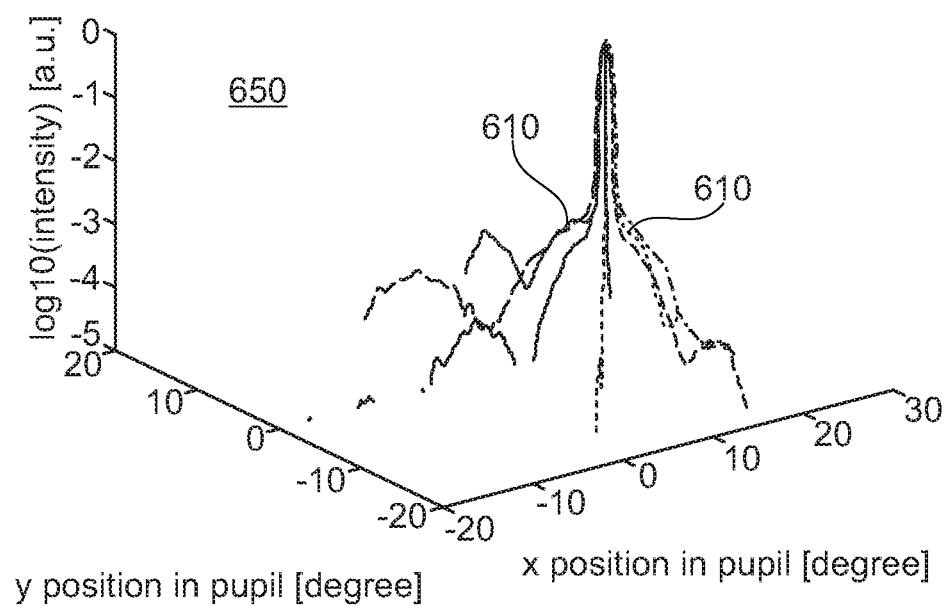

As already mentioned above, the determination of the pixel effects and their consideration is one of the crucial steps for performing an aerial image simulation according to the method described in the present application. It is important to recognize that the optical radiation distribution at the patterned surface 212 or the illumination pupil of a scanner or stepper typically depends on an angle of incidence (AOI) of the optical radiation incident on the pixels 220 of the pixel arrangement 225. This means that there is a specific collective modifying effect 235, 245 for each point at the patterned surface 212. As already indicated above, there are multiple possible ways to obtain the information necessary for determining the scattering kernel 235, 245, some of which are summarized in the following:

1. Direct measurements of pixel effects:
(a) Writing a pixel arrangement 225 in a mask substrate 210 and illuminating the mask substrate 210 (with pixels 220 written into it) with a small monopole illumination setting. The measurement of the effects of the pixel arrangement 225 can be performed by using a 2D sensor. For example, a 2D sensor may be realized in form of a CCD (Charge Coupled Device) camera, a CMOS (Complementary Metal Oxide Semiconductor) camera or a photo film. It is also possible to use a one-dimensional (1D) sensor along different directions and interpolation of these measurements. An example of a 1D detector is 1D CCD array. Further, a dot-shaped detector can also be used. Examples of dot-shaped detectors are photomultiplier tubes and ellipsometers. The upper part 600 of FIG. 6 shows two ellipsometer measurements as a function of an angle of the optical radiation directly passing through the photomask 210. In the example of FIG. 6, the incident optical radiation is an off-axis monopole illumination setting with a small diameter. The curve 610 shows the scattered optical radiation when the pixels 220 are arranged on a periodic grid, whereas the curve 620 represents the curves for a pixel arrangement which does not have a periodic 2D arrangement of pixels.

The lower part 650 of FIG. 6 shows a 3D representation of 2D ellipsometer measurements for a regular pixel arrangement 225. This means the lower part 650 presents the curve 610 of the upper part 600 measured along various directions in the pupil plane or at the rear surface 212 of the photomask 210. Similar to the upper part 600 of FIG. 6, the ordinate has a logarithmic scale.

Figure 7:
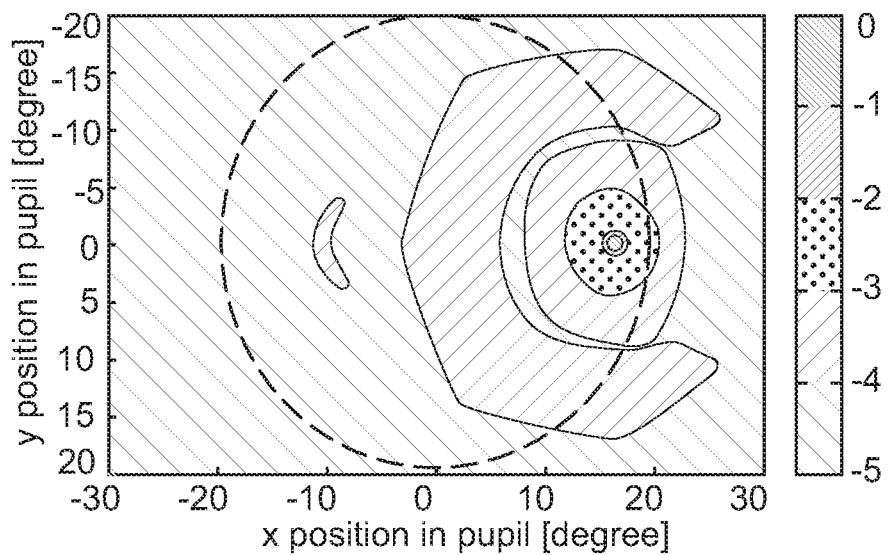
FIG. 7 represents reconstructions of an angular distribution of an optical intensity distribution determined from the ellipsometer measurements of FIG. 6, the pixels of the pixel arrangement are randomly distributed in the upper partial image, whereas the pixels of the lower partial image are arranged on a two-dimensional grid.
Figure 7:
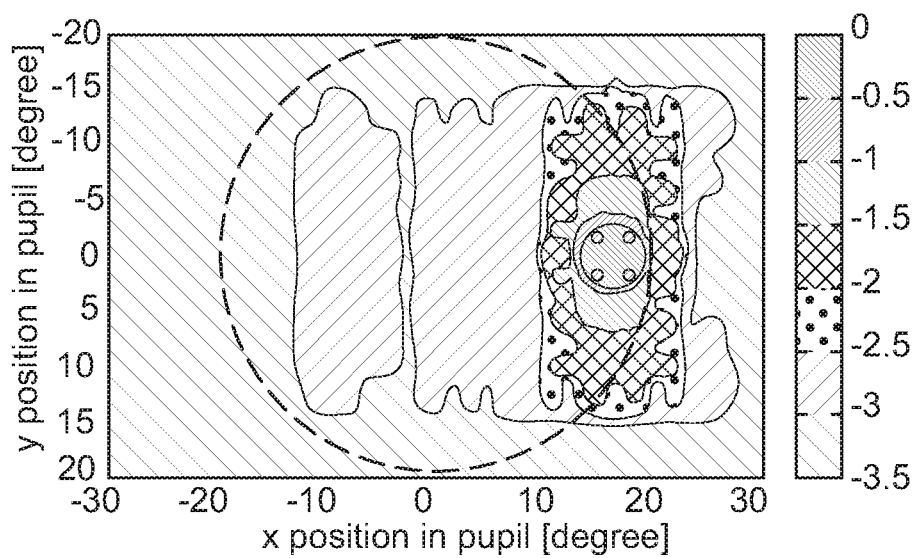

FIG. 7 presents the construction of the effects of the pixel arrangements for curves 620 (upper partial image 600) and curves 610 of FIG. 6 (lower partial image 650) along several directions at the rear surface 212 of the mask substrate 210 in a logarithmic intensity scale. The upper partial image of FIG. 7 shows an angular distribution of the scattered optical intensity for the non-periodic pixel arrangement 225 of the curve 620 of FIG. 6. The lower partial image of FIG. 7 presents the angular distribution of the scattered optical intensity for the periodic pixel arrangement of the curve 610. The lower partial image clearly shows a periodic structure which is attributed to the periodic pixel arrangement 225.

Figure 8:
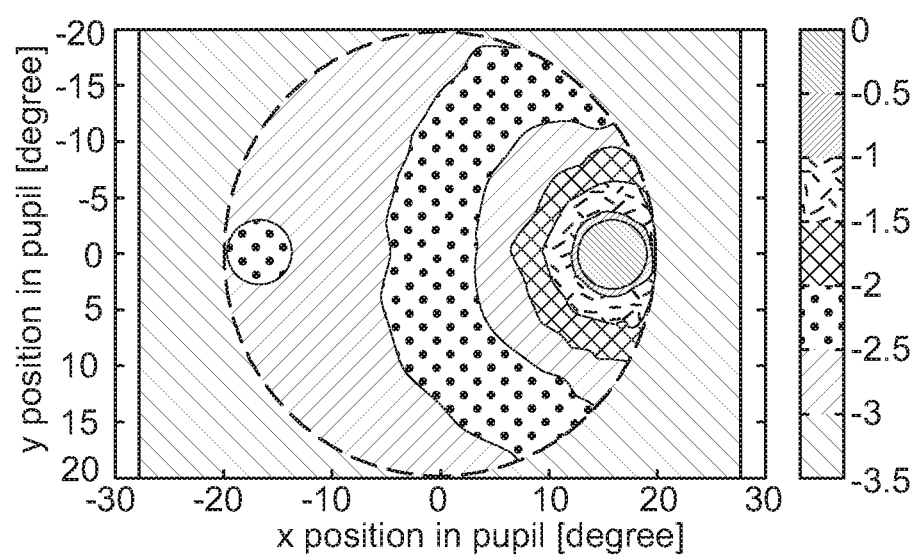
FIG. 8 shows a measured AIMS™ image for the pixel arrangement of the upper partial image of FIG. 7.

FIG. 8 shows the results of an AIMS™ (Aerial Image Measurement System) measurement of the reconstructed optical intensity distribution caused by the non-periodic pixel configuration of the upper partial image of FIG. 7 which is based on the curve 620 of FIG. 6. A comparison of the upper partial picture of FIG. 7 and FIG. 8 reveals that the reconstructed 2D optical intensity distribution based on 1D ellipsometer measurements well reproduces the measured aerial image of the non-periodic or randomly distributed pixel distribution.

(b) Illumination of a mask substrate 210 having the pixel arrangement 225 with a very clearly defined illumination setting, as for example small multipoles or an annular setting. The measurement is again performed as discussed in section (a). Processing of the 2D data occurs in combination with the knowledge on the illumination setting and allows a reconstruction of the AOI (Angle Of Incidence) dependent scattering kernel.

(c) The measurements are performed according to either (a) or (b), but the measurements are not performed at the actinic wavelength, i.e. preferably not at 193 nm. In this case, the determined scattering distribution of FIG. 7 is converted to the actinic wavelength by scaling the scattering angles with the difference of the actinic and the measured wavelength.

2. Calculation of the pixel effects:

(a) As already mentioned above, knowledge of the shape of a pixel can be obtained either from a lookup table, a model or from measurements (see first section). This knowledge allows to calculate the pixel effects, i.e. predominantly their scattering behaviour, wherein the application of Mie-scattering is a promising approach.

(b) As discussed in the first section, knowledge of the pixel arrangement 225, i.e. whether the pixels 220 are randomly distributed in the arrangement or on a grid, can be used to superimpose a diffraction pattern on the determined effect of a single pixel.

(c) Attenuation data obtained from a direct measurement of a pixel arrangement 225 having a specific pixel pitch can be used to calculate how a collective modifying effect looks for any other pixel pitch.

(d) Data obtained for monopole illumination settings positioned at different positions at the patterned surface 212 can be used to interpolate in between and for obtaining scattering information for these intermediate monopole positions.

(e) Due to tool-to-tool variations, a pixel shape might slightly differ for different RegC© or CDC32 tools. These variations also affect the collective modifying effect of the scattering kernel. Therefore, establishing a database of measurements can allow the generation of average pixel shapes or average scattering kernels.

As discussed in the context of FIGS. 6 to 8 above, the process flow described in this application uses collective modifying effects based on alternative 1a, in particular obtaining the effect of pixels 220 by using an ellipsometer that works at 193 nm. As already indicated above, an ellipsometer measures 1D cross-sections by moving the ellipsometer along one direction. The lower part of FIG. 7 shows several 1D cross sections combined to represent a 2D scattering profile of a single monopole setting. Based on these 1D measurements, interpolations are executed to different attenuations and monopole positions according to items 2c and 2d indicated above. The lower partial image 650 of FIG. 6 presents cross-sections measured with an ellipsometer at the rear surface 212 of the mask substrate 210 with a monopole illumination setting having an AOI of 16.3°. In order to obtain a comprehensive set of data, it is necessary to repeat the cross-section sampling for all AOIs and azimuthal angles.

Figure 9:
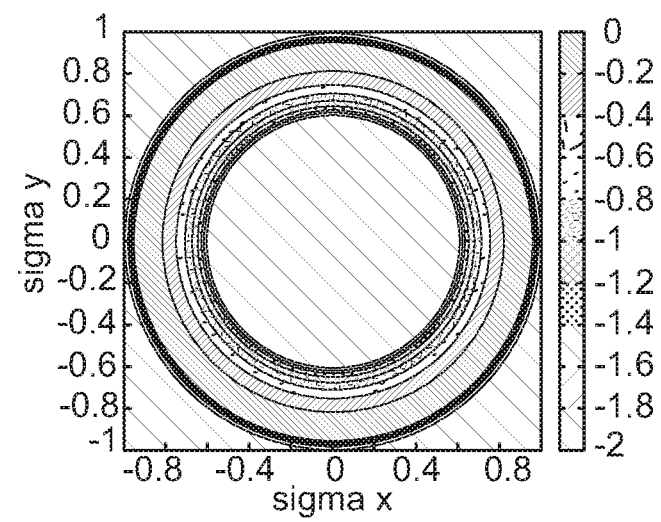
FIG. 9 presents a determination of a modified optical radiation distribution for an annular illumination setting of an illumination system, a mask substrate does not have pixels in the upper partial image, the pixels of the pixel arrangement are randomly distributed in the middle partial image, and the pixels are arranged on a grid in the lower partial image.
Figure 9:
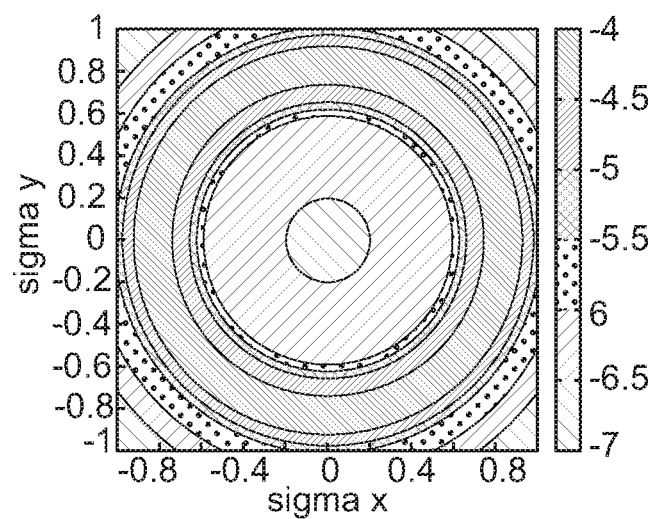
Figure 9:
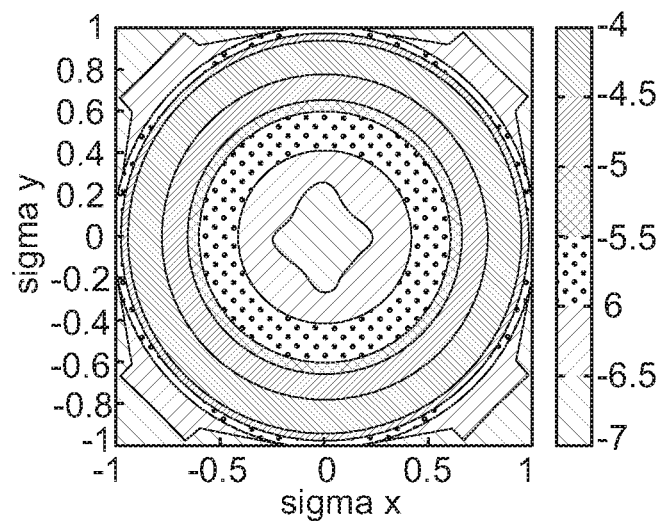
Figure 10:
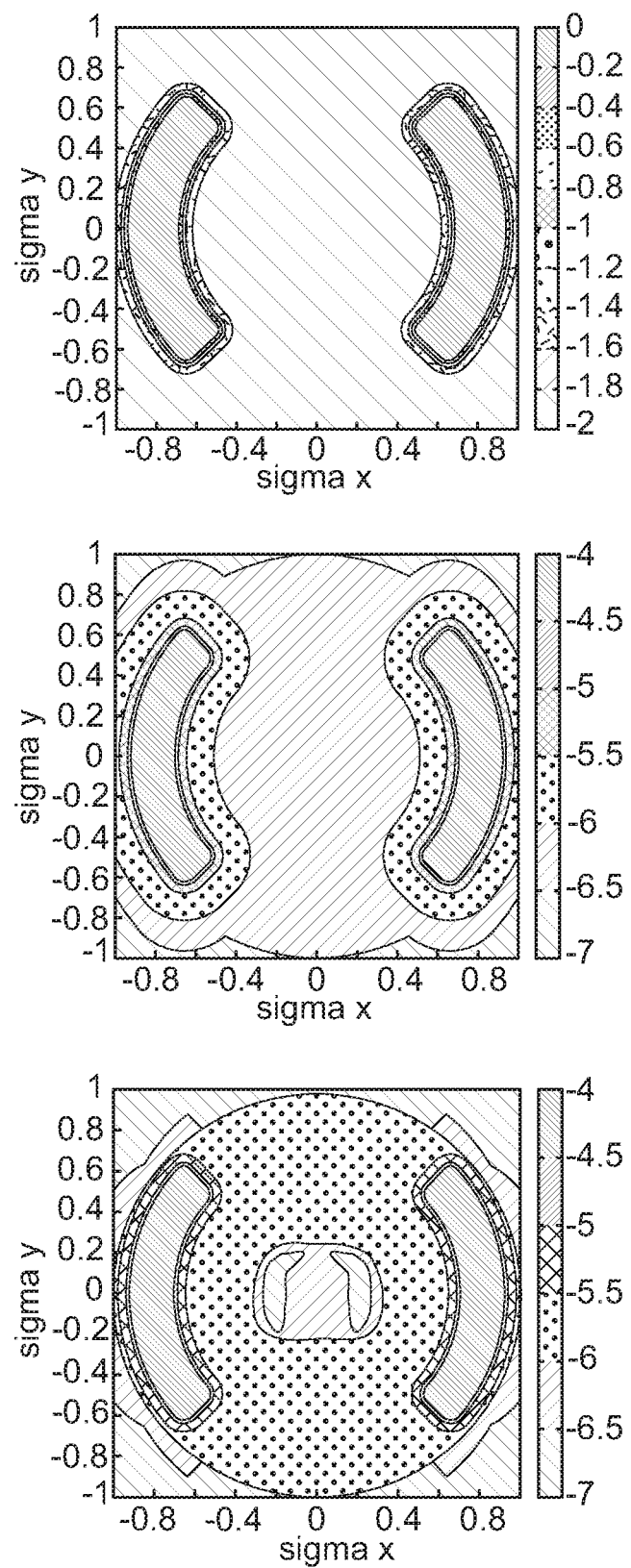
FIG. 10 reproduces FIG. 9 for a Disar illumination setting.

When the scattering information of a pixel arrangement 225 is available, it can be used to generate a modified optical radiation distribution at a rear surface 212 of a mask substrate 210. FIGS. 9 and 10 show modified optical radiation distributions at a patterned surface 212 based on the above discussed considerations. FIG. 9 presents an annular intensity distribution at the rear surface 212 of a mask substrate 210 or at the illumination pupil of a stepper or a scanner again on a logarithmic scale. In the upper partial image, the mask substrate does not have any pixels 220. Each point at the rear surface 212 of the mask substrate 210 or in the illumination pupil of a scanner or a stepper is characterized by an optical intensity or a relative power. In the middle partial image, the substrate comprises a pixel arrangement in which the pixels are randomly distributed in a plane which is essentially arranged central between the front 202 and the rear surface 212 of the mask substrate 210. In the lower partial image, the pixels 220 of the pixel arrangement 225 are arranged on a grid. The blurred illumination pupil comprises a summation of the scattering kernels adjusted for a target attenuation, originating at each point in the unblurred illumination pupil, and scaled with a relative power at that point.

FIG. 10 repeats the partial images of FIG. 9 for a Disar illumination setting of the illumination system. Similar to FIG. 7, the regular pixel arrangement 225 of FIGS. 8 and 9 show a diffraction structure by which the periodicity of the pixel arrangement 225 is reproduced, whereas the pixel arrangement based on randomly arranged pixels 220 does not contain a diffraction structure. In FIGS. 9 and 10 the middle and the low partial images scale from $10^{-4}$ to $10^{-7}$, and so only show the halo or the blur caused by the pixels 220 in the mask substrate 210.

A special normalization is performed in order to represent the effect of the optical redistribution executed by the pixels 220. The scattering kernel 235, 245 itself or any other method representing the pixel scattering effect has also to contain an optical attenuation component which accounts for the part of the optical radiation distribution which is scattered away from the pupil or which is absorbed by the pixels 220. This is illustrated on the basis of FIGS. 11 (for an annular illumination setting) and 12 (for a Disar illumination setting). The total energy incident on the mask substrate 210 can be expressed by: T=1. When the mask does not have pixels 220 the total energy is concentrated within the illumination setting at the rear surface 212 of the mask substrate 210 as indicated by the dotted circle 1110 and 1210 in the upper partial images of FIGS. 11 and 12. When the mask substrate 210 has pixels 220 the optical intensity within the annular setting is P=92.3% and P=92.6% for the DISAR setting. The total energy available at the rear surface 320 of the mask substrate 310 is T=98.9% for the annular setting and T=98.4% for the Disar setting. T comprises the optical intensity integrated across the rear surface 212. The difference to the incident optical intensity (T=1) indicates back-scattering or absorption of optical radiation within the mask substrate 210. The attenuation for both settings is 4%. The lower partial images of FIGS. 11 and 12 show this data.

Further, the WLCD (Wafer Level Critical Dimension) or AIMS™ (Aerial Image Metrology System) metrology solution can also be used for a validation of the simulated CD effect of the pixels 220. In this alternative, the aerial image simulation of the photomask 210 is not used to simulate how a scanner sees the modified optical radiation distribution and how the modified optical radiation distribution is printed on a wafer, but how the WLCD metrology tool sees the modified photomask 210, or more precisely, the modified optical radiation distribution at the patterned surface 212. Moreover, by referring the effects induced by pixels 220 to the plane of the aerial image simulation, the simulation of the photoresist can be avoided.

In order to use the WLCD tool for analysing pixel effects in photolithographic masks 210, it is beneficial to establish a calibration relation between various pixel arrangements 225 generated in a mask substrate 210 and the changes measured by the WLCD metrology tool. After having established the calibration relation, a simulation process comprising a RegC© or a CDC32 tool and a WLCD or an AIMS® tool can be used to investigate the effect of various pixel arrangements 225 on the printing of wafers in a closed loop configuration. In particular, a simulation process can be used to optimize the process window (PW) for a specific photomask 210 by varying the pixel arrangement 225, the illumination setting and for the NA of an illumination system.

Figure 11:
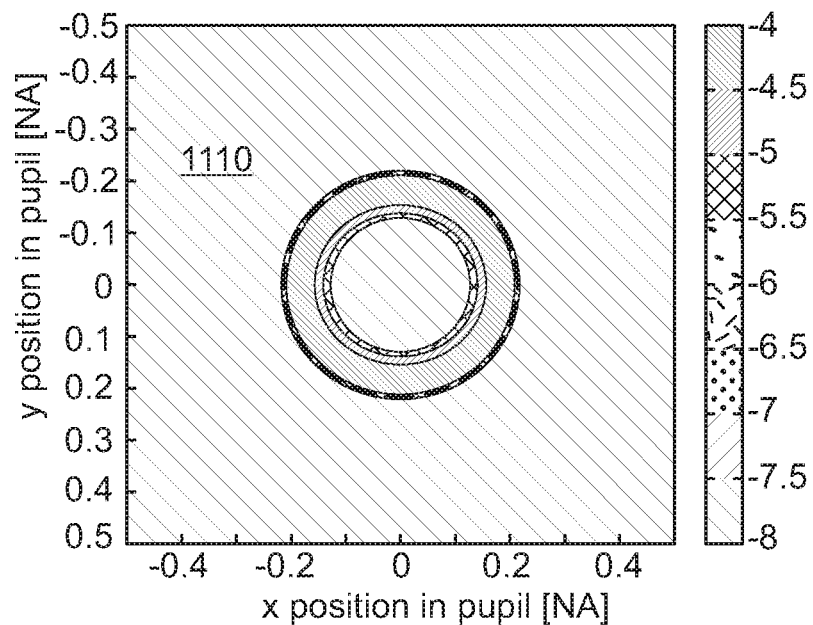
FIG. 11 illustrates the energy preservation for the annular illumination setting of FIG. 9.
Figure 11:
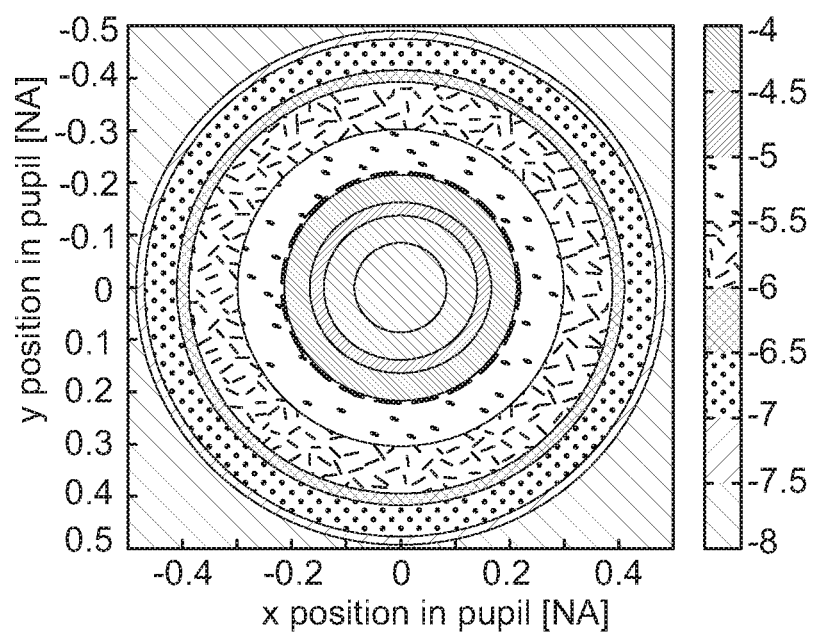
Figure 12:
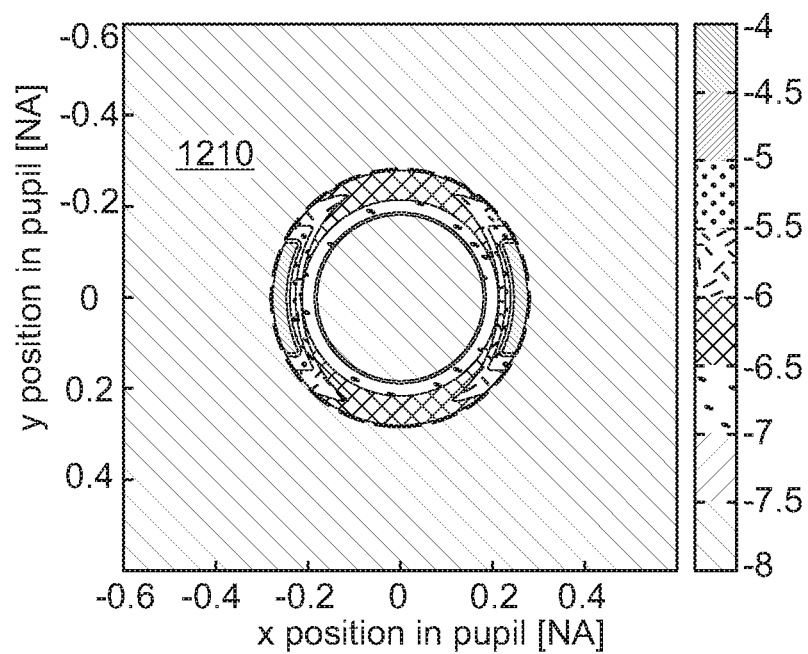
FIG. 12 shows the energy preservation for the Disar illumination setting of FIG. 10.
Figure 12:
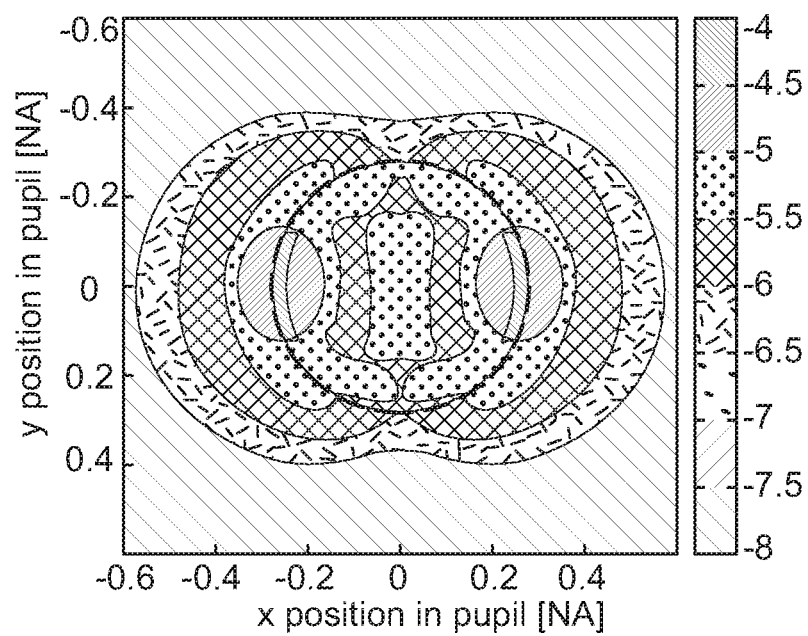

As discussed in the context of FIGS. 11 and 12, the integral of the optical intensity distribution across the patterned surface 212 is always normalized to 1 during an aerial image simulation of a photomask 210. The pixels 220 of a pixel arrangement 225 do not only redistribute the optical radiation in the patterned surface 212, but also lead to a reduction of the optical intensity in the patterned surface 212. (T is smaller than 1 in the lower partial images of FIGS. 11 and 12). Therefore, the optical intensity in the patterned surface 212 needs to be scaled to the optical intensity in the patterned surface 212 after the introduction of the pixel arrangement 225.

Figure 13:
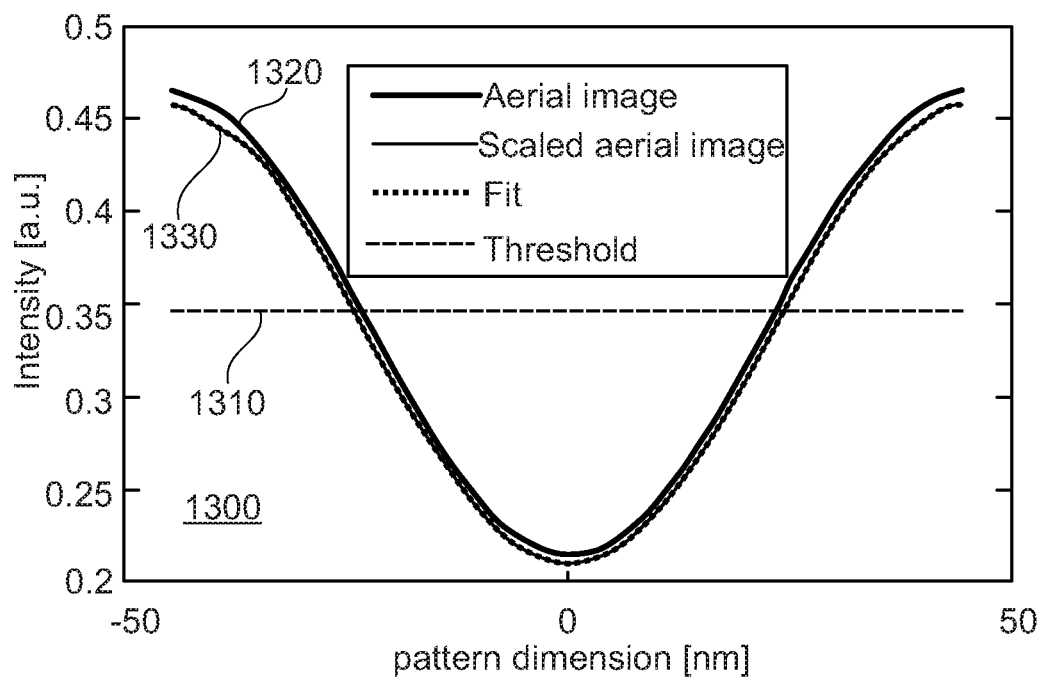
FIG. 13 shows sine curves of aerial image simulations in the upper partial image, the upper curve represents an aerial image simulation without scaling of the optical intensity, and the lower curve presents the aerial image simulation of the upper curve after scaling or normalizing the optical intensity, the lower partial image represents the CDCR (Critical Dimension Correction Ratio) as a function of the attenuation of the transmitted optical intensity.
Figure 13:
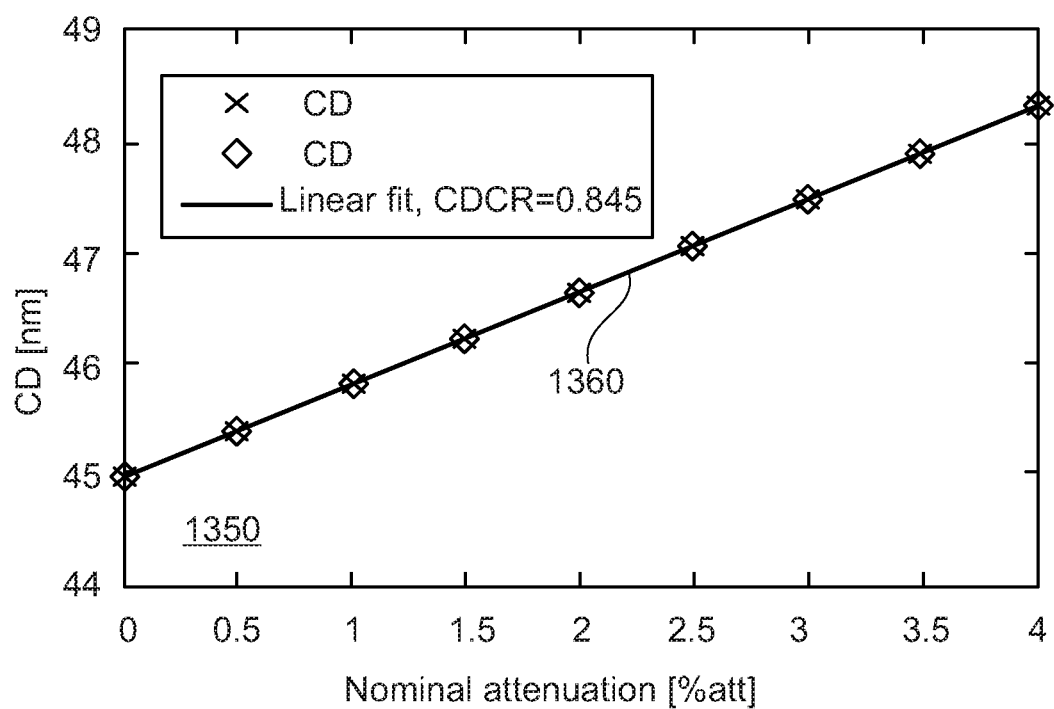

FIG. 13 illustrates this process. The simulation was done with a line/space pattern of a 65 nm design or target CD. In a first step, an aerial image simulation process is performed without pixels 220 in the mask substrate 210. Then the optical intensity threshold is determined from the resulting curve, namely, it is determined where the simulated CD is equal to the target CD. This is the dashed line 1310 in the upper partial image 1300 of FIG. 13. Then, in the next step, several aerial image simulations are performed using generated modified optical radiation distributions caused by different pixel arrangements 225 which correspond to different attenuation levels. The resulting curves from each of these aerial image simulation runs (indicated by a curve 1320 in FIG. 13) are scaled by the respective integral of the total optical intensity which is denoted as T in FIGS. 11 and 12. As T is smaller than 1, the scaled aerial image curves (symbolized by a curve 1330 in FIG. 13) are always below the unscaled aerial image results.

In order to obtain the CD for each attenuation of the pixel arrangement 225, the scaled simulated aerial images are evaluated at the threshold optical intensity. The diagram of the lower partial image 1350 of FIG. 13 shows that the CD almost linearly changes as a function of the attenuation of the optical intensity. The slope of the fitted line 1360 corresponds to the CDCR (Critical Dimension Correction Ratio).

Figure 14:
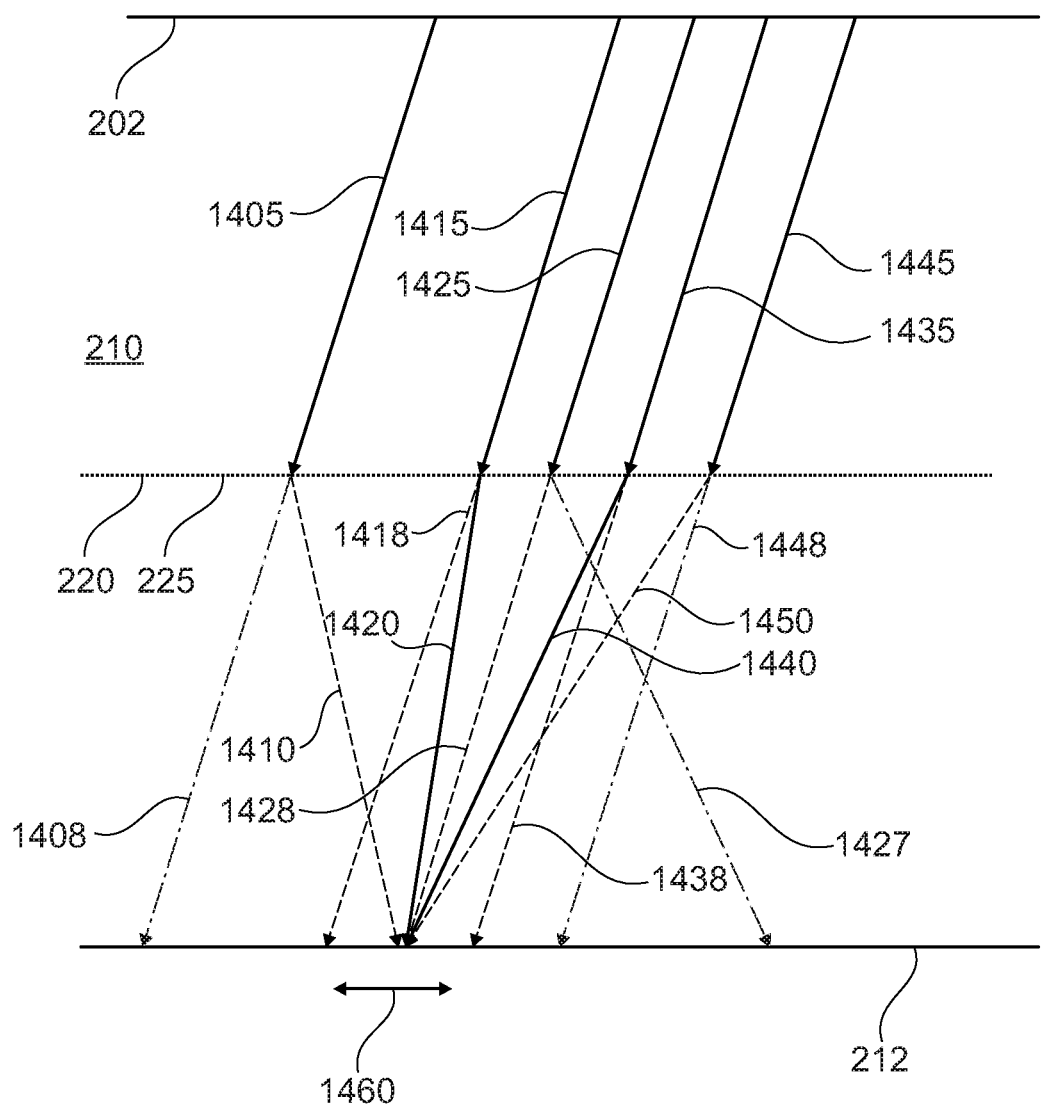
FIG. 14 schematically shows a section of a photolithographic mask having an arrangement of pixels, the mask is irradiated by a monopole illumination and the transmitted optical radiation distribution is measured by a WLCD tool.

FIG. 14 illustrates some of the present limitations for experimentally validating the simulated CD effect of the pixels 220 of a pixel arrangement 225. FIG. 14 schematically shows a cross-section of a mask 210 having a front surface 202 and a rear surface 212. The pixels 220 of the pixel arrangement 225 are arranged in half of the depth or the height of the photomask 210. The front surface 202 of the mask 210 is obliquely irradiated by an optical radiation distribution illustrated by the light rays 1405, 1415, 1425, 1435, 1445.

The opening 1460 of the WLCD tool used for the detection of the optical radiation distribution leaving the mask 210 at the rear surface 212 is indicated by a double arrow. The incident light rays 1415, 1425 and 1435 are within the opening 1460 of the WLCD tool when these rays transmit the mask 210 without being scattered by the pixels 220 of the pixel arrangement 225. This is illustrated in FIG. 14 by the light rays 1418, 1428 and 1438. The rays 1420 and 1440 symbolize the optical radiation which is scattered by the pixels 220 from the incident light rays 1415 and 1435 to the center of the opening 1460 of the WLCD tool. Further, as indicated by the light ray 1427 in FIG. 14, a portion of the scattered optical radiation distribution does not hit the opening 1460 of the detection tool due to its limited area.

The incident light rays 1405 and 1445 are outside of the opening 1460. Hence, the portion of the optical radiation which is not affected by the pixels 220 does not hit the opening 1460 of the WLCD detector. This is illustrated in FIG. 14 by the light beams 1408 and 1448. However, a portion of the optical radiation distribution scattered by the pixels 220 of the pixel arrangement 225 hits the central part of the opening 1460 of the WLCD detector as indicated by the light rays 1410 and 1450.

Thus, as a consequence of the limited area of the opening 1460 of the WLCD tool, the resulting scattering image captured by the opening 1460 does only contain a portion of the redistribution caused by the pixels 220 of the pixel arrangement 225. The resulting scattering image only contains the attenuation of the incident light beams 1415, 1425 and 1435 as illustrated by the scattered light ray 1427 in FIG. 14.

FIG. 15 presents the results of a study performed for different feature types, illumination settings and polarization types. Feature types 1, 3 and 4 correspond to a dense line/space pattern, a sparse line/sparse pattern, and some other pattern. The SMO illumination setting stands for Source Mask Optimization as already indicated above. The fourth column of the table of FIG. 15 indicates the target CD for the aerial image simulation. The fifth column describes the measured CDCR and the sixth column reproduces the CDCR data obtained from aerial image simulations. The measured and simulated data of the first, second and fourth line agree very well. Larger deviations of measured and simulated data, as indicated in the third line of the table of FIG. 15, can arises from an incomplete knowledge of the illumination setting and mask pattern, the polarization of the incident optical radiation, the target CD, a tool-to-tool variation of the pixel shape, and/or resist effects.

In the following, the CDCR simulation procedure is briefly summarized:
1. Generate a synthetic kernel:
   The synthetic kernel is calculated on the basis of ellipsometer measurements and in such a manner that the transmission peak at a patterned surface of a photomask is preserved.
2. Modifying the optical radiation distribution at the patterned surface or blur the illumination pupil with the synthetic kernel:
   A scattering kernel or a modified optical radiation distribution is computed for each point in the patterned surface of a photomask. The scattering kernel takes into account the change of the angular distribution seen by each point in the patterned surface.
3. Perform aerial image simulation:
   The aerial image simulation is performed with the modified optical radiation distribution and the design pattern of the photomask. The integral across the patterned surface is set to 1 in the simulation process. Results are simulated aerial images.
4. Scale aerial images:
   During the aerial image simulation, the integrated optical intensity was set to 1. Now it is scaled with the integral of the respective blurred illumination pupil (see FIGS. 11 and 12).
5. For aerial images without pixels in the photomask:
   Fit a sine function to the mask pattern; and
   Calculate a threshold optical intensity for the design or target CD.
6. For aerial images with pixels in the photomask:
   Fit a sine function to the mask pattern; and
   Calculate the CD at the threshold optical intensity.

Finally, the CDCR is decomposed into terms that can be measured by independent metrology systems. The CDCR computation formula can be presented as:

$$\frac{\partial CD}{\partial PD} = \frac{\partial CD}{\partial \text{Dose}} \cdot \frac{\partial \text{Dose}}{\partial PD} + \frac{\partial CD}{\partial \text{Pupil}} \cdot \frac{\partial \text{Pupil}}{\partial PD}$$

where PD is the pixel density and no longer the attenuation. This description is more universal and does not depend on the DUV (Deep Ultra-Violet) illumination system.

$$\frac{\partial CD}{\partial \text{Dose}}$$

describes the pure dose sensitivity of the CD, and is a result of aerial image simulations $$\frac{\partial CD}{\partial \text{Pupil}}$$

describes the sensitivity of the CD to the illumination pupil of the scanner, and is also obtained as a result of aerial image simulations $$\frac{\partial \text{Dose}}{\partial PD}$$

is a reduction of the dose at the patterned surface by pixels; it is a derivative of the scattering kernel $$\frac{\partial \text{Pupil}}{\partial PD}$$

is the blurring of the illumination pupil, while keeping the integral of the optical intensity constant, and is a derivative of the scattering kernel.

In some implementations, the processing of data (e.g., calibration processes, simulation processes, and determinations of modified optical radiation distributions) described above can be implemented by a simulation unit, which can include one or more data processors for processing data, one or more storage devices for storing data, such as one or more databases, and/or one or more computer programs including instructions that when executed by the computer system causes the computer system to carry out the computations or processes described above. The simulation unit can include one or more input devices, such as a keyboard, a mouse, a touchpad, and/or a voice command input module, and one or more output devices, such as a display, and/or an audio speaker. The simulation unit can show graphical user interfaces on the display to assist the user of the error correction apparatus.

In some implementations, the simulation unit can include digital electronic circuitry, computer hardware, firmware, software, or any combination of the above. The features related to processing of data can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. Alternatively or addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

In some implementations, the operations associated with processing of data described in this document can be performed by one or more programmable processors executing one or more computer programs to perform the functions described in this document. A computer program can be written in any form of programming language, including compiled or interpreted languages, and it can be deployed in any form, including as a stand-alone program or as a module, component, subroutine, or other unit suitable for use in a computing environment.

For example, the simulation unit can be a computer that is configured to be suitable for the execution of a computer program and can include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as hard drives, magnetic disks, magneto-optical disks, or optical disks. Machine-readable storage media suitable for embodying computer program instructions and data include various forms of non-volatile storage area, including by way of example, semiconductor storage devices, e.g., EPROM, EEPROM, and flash storage devices; magnetic disks, e.g., internal hard disks or removable disks; magneto-optical disks; and CD-ROM and DVD-ROM discs.

In some implementations, the data processing (e.g., calibration processes, simulation processes, and determinations of modified optical radiation distributions) described above can be implemented using software for execution on one or more mobile computing devices, one or more local computing devices, one or more remote computing devices, and/or one or more cloud computing servers. For instance, the software forms procedures in one or more computer programs that execute on one or more programmed or programmable computer systems, either in the mobile computing devices, local computing devices, or remote computing systems (which may be of various architectures such as distributed, client/server, or grid), each including at least one processor, at least one data storage system (including volatile and non-volatile memory and/or storage elements), at least one wired or wireless input device or port, and at least one wired or wireless output device or port.

In some implementations, the software may be provided on a medium, such as a CD-ROM, DVD-ROM, Blu-ray disc, hard drive, or flash drive, readable by a general or special purpose programmable computer or delivered (encoded in a propagated signal) over a network to the computer where it is executed. The functions may be performed on a special purpose computer, or using special-purpose hardware, such as coprocessors. The software may be implemented in a distributed manner in which different parts of the computation specified by the software are performed by different computers. Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system may also be considered to be implemented as a computer-readable storage medium, configured with a computer program, where the storage medium so configured causes a computer system to operate in a specific and predefined manner to perform the functions described herein.

While this specification contains many implementation details, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. The separation of various system components in the embodiments described above should not be understood as requiring such separation in all embodiments. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the invention have been described. Other embodiments are within the scope of the following claims. In addition, the actions recited in the claims can be performed in a different order and still achieve desirable results.

What is claimed is:

1. A computer-implemented method for performing an aerial image simulation of a photolithographic mask, the method comprising the following steps:
   a. changing at least one parameter of the aerial image simulation, wherein the at least one parameter comprises at least one of: a first arrangement of pixels, a mask pattern, an illumination setting, a numerical aperture, a mask type, or a feature type of the photolithographic mask;
   b. modifying, in a simulation process using one or more computers, an optical radiation distribution at a patterned surface of the photolithographic mask, depending on at least one first arrangement of pixels to be generated in the photolithographic mask; and
   c. performing, using the one or more computers, the aerial image simulation of the photolithographic mask as part of a calibration process of a photomask defect correction process by using the generated modified optical radiation distribution to qualify an effect of the at least one first arrangement of pixels on an illumination of a wafer by using the photolithographic mask wherein step b. comprises determining a collective modifying effect of the at least one first arrangement of pixels for each point at the patterned surface, the determining comprising a combination of modifying effects of a plurality of pixels of the at least one first arrangement of pixels which contributes optical radiation to this point; and
   wherein the collective modifying effect of the plurality of pixels of the at least one first arrangement of pixels at a point at the patterned surface of the photolithographic mask changes an angular distribution of the optical radiation distribution received at this point.

2. The method of claim 1, wherein the plurality of pixels of the at least one first arrangement of pixels essentially comprises all pixels which contribute optical radiation to the point at the patterned surface.

3. The method of claim 1, wherein modifying the optical radiation distribution at the patterned surface comprises modifying an optical radiation distribution without the at least one first arrangement of pixels with the determined collective modifying effect for each point of the patterned surface.

4. The method of claim 1, wherein step b. is based on at least one of: a look-up table, a metrology system measuring an effect of at least one second arrangement of pixels generated in a mask substrate, or a simulation model simulating the effect of individual pixels.

5. The method of claim 4, wherein measuring the effect of the at least one second arrangement of pixels within the mask substrate comprises illuminating the second pixel arrangement at a wavelength different than the actinic wavelength and correcting the effect of the wavelength difference, in particular correcting wavelength dependent scattering angles.

6. The method of claim 1, wherein step a. further comprises determining mask pattern data from a design pattern, a measured pattern, or both.

7. The method of claim 1, further comprising prior to step b. measuring the optical radiation distribution at the patterned surface of the photolithographic mask, or calculating the optical radiation distribution at the patterned surface from a radiation source, optical elements, a numerical aperture (NA), and an illumination setting of an illumination system.

8. The method of claim 1, wherein step b. further comprises normalizing the modified optical radiation distribution.

9. The method of claim 1, further comprising the step of applying a photoresist model for simulating an effect of the illumination of the photoresist arranged on a wafer.

10. The method of claim 9, further comprising the step of determining a critical dimension correction ratio and/or an image placement correction of the wafer.

11. The method of claim 10, further comprising the step of comparing the determined critical dimension correction ratio and/or the image placement correction with measurements performed with a metrology tool.

12. The method of claim 11, further comprising the step of performing the aerial image simulation and a photoresist simulation with the changed modified optical radiation distribution.

13. The method of claim 1, wherein step c. further comprises considering a coherence of the optical radiation distribution when performing the aerial image simulation of the photolithographic mask.

14. The method of claim 13, wherein step b. further comprises retrieving a phase of the optical radiation distribution.

15. The method of claim 1, further comprising one or more of the steps of:
   d. measuring a photolithographic mask without having an arrangement of pixels with an aerial image metrology tool;
   e. generating at least two different arrangements of pixels in the photolithographic mask;
   f. measuring the at least two different arrangements of pixels with the aerial image metrology tool; and
   g. determining a calibration relation of the aerial image simulation based on the measurement data of the aerial image metrology tool obtained in steps d. and f.

16. The method of claim 15, further comprising one or more of the steps of: changing at least one of the parameters; performing the aerial image simulation; and determining the effect of the changed at least one parameter on the illumination of the wafer based on the calibration relation in a closed loop simulation.

17. The method of claim 15, further comprising the step of comparing the determined critical dimension correction ratio and/or the image placement correction for a photolithographic mask having the pixel arrangements of steps d. and e. with measured aerial images and/or simulated aerial images in order to determine a second calibration relation.

18. A computer-readable medium storing a computer program comprising instructions for performing the method of claim 1.

19. A simulation unit, the simulation unit being adapted to perform the method of claim 1.

20. A method comprising:
   performing, using one or more computers, an aerial image simulation of a photolithographic mask, comprising:
      changing at least one parameter of the aerial image simulation, wherein the at least one parameter comprises at least one of: a first arrangement of pixels, a mask pattern, an illumination setting, a numerical aperture, a mask type, or a feature type of the photolithographic mask;
      modifying, in a simulation process, an optical radiation distribution at a patterned surface of the photolithographic mask, depending on at least one first arrangement of pixels to be generated in the photolithographic mask; and
      performing the aerial image simulation of the photolithographic mask as part of a calibration process of a photomask defect correction process by using the generated modified optical radiation distribution to qualify an effect of the at least one first arrangement of pixels on an illumination of a wafer by using the photolithographic mask; and
   generating the at least one first arrangement of pixels in the photolithographic mask wherein modifying the optical radiation distribution comprises determining a collective modifying effect of the at least one first arrangement of pixels for each point at the patterned surface, the determining comprising a combination of modifying effects of a plurality of pixels of the at least one first arrangement of pixels which contributes optical radiation to this point; and
   wherein the collective modifying effect of the plurality of pixels of the at least one first arrangement of pixels at a point at the patterned surface of the photolithographic mask changes an angular distribution of the optical radiation distribution received at this point.

21. The method of claim 20, comprising:
   performing, using one or more computers, multiple aerial image simulations of a photolithographic mask, comprising:
      using multiple sets of parameter values associated with a plurality of parameters for the multiple aerial image simulations, wherein different sets of parameter values are used for different simulations, and each simulation comprises:
         applying a set of parameter values associated with the plurality of parameters in the simulation, and changing at least one parameter of the aerial image simulation to use a different parameter value as compared to previous simulations, wherein the at least one parameter comprises at least one of: a first arrangement of pixels, a mask pattern, an illumination setting, a numerical aperture, a mask type, or a feature type of the photolithographic mask;
         modifying an optical radiation distribution at a patterned surface of the photolithographic mask, depending on at least one first arrangement of pixels to be generated in the photolithographic mask; and
         performing the aerial image simulation of the photolithographic mask by using the generated modified optical radiation distribution;
   from among the various sets of parameter values used in the simulations, select a set of parameter values that result in better performance as compared to other sets of parameter values; and
   generating the at least one first arrangement of pixels in the photolithographic mask using the selected set of parameter values.

* * * * *

UNITED STATES PATENT AND TRADEMARK OFFICE
CERTIFICATE OF CORRECTION

PATENT NO. : 11,366,382 B2
APPLICATION NO. : 16/798696
DATED : June 21, 2022
INVENTOR(S) : Vladimir Dmitriev et al.

It is certified that error appears in the above-identified patent and that said Letters Patent is hereby corrected as shown below:

On the Title Page

Column 1 (Assignee)
Line 2, delete "Ltd," and insert -- Ltd., --.

In the Specification

Column 10
Line 63, delete "AIMS'" and insert -- AIMS™ --.

In the Claims

Column 22
Line 1, in Claim 1, delete "mask" and insert -- mask; --.

Column 24
Line 4, in Claim 20, delete "mask" and insert -- mask; --.

Signed and Sealed this
Eleventh Day of October, 2022

Katherine Kelly Vidal
*Director of the United States Patent and Trademark Office*